United States Patent
Araki

(10) Patent No.: US 10,930,843 B2
(45) Date of Patent: Feb. 23, 2021

(54) PROCESS FOR MANUFACTURING SCALABLE SPIN-ORBIT TORQUE (SOT) MAGNETIC MEMORY

(71) Applicant: SPIN MEMORY, INC., Fremont, CA (US)

(72) Inventor: Satoru Araki, San Jose, CA (US)

(73) Assignee: SPIN MEMORY, INC., Wilmington, DE (US)

( * ) Notice: Subject to any disclaimer, the term of this patent is extended or adjusted under 35 U.S.C. 154(b) by 74 days.

(21) Appl. No.: 16/223,077

(22) Filed: Dec. 17, 2018

(65) Prior Publication Data

US 2020/0194666 A1    Jun. 18, 2020

(51) Int. Cl.
*H01L 43/14*    (2006.01)
*H01L 43/06*    (2006.01)
(Continued)

(52) U.S. Cl.
CPC ............ *H01L 43/14* (2013.01); *G11C 11/161* (2013.01); *H01L 27/228* (2013.01); *H01L 43/04* (2013.01); *H01L 43/065* (2013.01); *G11C 11/1655* (2013.01); *G11C 11/1657* (2013.01); *G11C 11/1673* (2013.01); *G11C 11/1675* (2013.01)

(58) Field of Classification Search
None
See application file for complete search history.

(56) References Cited

U.S. PATENT DOCUMENTS 5,026,682 A * 6/1991 Clark .................... H01L 39/225
257/34
5,231,349 A * 7/1993 Majidi-Ahy ....... G01R 1/06772
324/72.5
(Continued)

FOREIGN PATENT DOCUMENTS

JP     5985728 B1    9/2016
JP    2017059634 A    3/2017
(Continued)

OTHER PUBLICATIONS

Spin Memory, Inc., International Search Report and Written Opinion, PCT/US2019/066887, dated Jun. 24, 2020, 15 pgs.

*Primary Examiner* — David E Graybill
(74) *Attorney, Agent, or Firm* — Morgan, Lewis & Bockius LLP

(57) ABSTRACT

A method of fabricating a magnetic storage device includes depositing a first conductive material. The method further includes electrically isolating distinct instances of the first conductive material to form a first wire extending along a first direction. The method further includes depositing, on the distinct instances of the first conductive material, a set of device layers. The method further includes electrically isolating distinct instances of the device layers to form spin orbit torque magnetic random access memory (SOT-MRAM) devices positioned on distinct instances of the first conductive material. The method further includes depositing, on the distinct instances of the device layers, a layer of a second conductive material and electrically isolating a plurality of distinct instances of the layer of the second conductive material to form a plurality of second wires extending along a second direction. The second direction is different from the first direction.

13 Claims, 14 Drawing Sheets

(51) Int. Cl.
  *H01L 43/04* (2006.01)
  *H01L 27/22* (2006.01)
  *G11C 11/16* (2006.01)

(56) References Cited

U.S. PATENT DOCUMENTS

| | | | |
|---|---|---|---|
| 6,577,528 B2 * | 6/2003 | Gogl | G11C 8/12 |
| | | | 365/158 |
| 6,682,999 B1 * | 1/2004 | Mucha | H01L 21/7682 |
| | | | 257/E21.581 |
| 6,982,240 B1 * | 1/2006 | Clark | H01L 39/225 |
| | | | 257/E39.015 |
| 7,161,861 B2 * | 1/2007 | Gogl | G11C 5/145 |
| | | | 365/205 |
| 7,577,041 B2 * | 8/2009 | Ueda | G11C 16/10 |
| | | | 365/149 |
| 7,819,979 B1 | 10/2010 | Chen et al. | |
| 8,194,439 B2 * | 6/2012 | Kim | G11C 8/14 |
| | | | 365/158 |
| 8,514,618 B2 * | 8/2013 | Lombard | G11C 11/1659 |
| | | | 365/158 |
| 8,804,409 B2 * | 8/2014 | Hoya | G11C 7/1006 |
| | | | 365/158 |
| 9,076,537 B2 | 7/2015 | Khvalkovskiy et al. | |
| 9,105,830 B2 * | 8/2015 | Khvalkovskiy | G11C 11/16 |
| 9,105,832 B2 * | 8/2015 | Buhrman | G11C 11/1673 |
| 9,218,864 B1 | 12/2015 | Yi et al. | |
| 9,230,626 B2 * | 1/2016 | Buhrman | H01L 43/08 |
| 9,230,627 B2 * | 1/2016 | Wu | G11C 11/1675 |
| 9,300,301 B2 * | 3/2016 | Bromberg | G11C 11/161 |
| 9,324,402 B2 * | 4/2016 | Wu | H01L 43/14 |
| 9,343,658 B2 | 5/2016 | Wang et al. | |
| 9,502,087 B2 * | 11/2016 | Buhrman | G11C 11/1697 |
| 9,508,925 B2 * | 11/2016 | Pi | H01L 43/10 |
| 9,576,631 B2 * | 2/2017 | Buhrman | G11C 11/1673 |
| 9,589,619 B2 | 3/2017 | Lee et al. | |
| 9,620,188 B2 * | 4/2017 | Manipatruni | G11C 11/161 |
| 9,633,708 B2 * | 4/2017 | Ohsawa | G11C 11/1675 |
| 9,666,256 B1 * | 5/2017 | Lai | G11C 11/18 |
| 9,691,458 B2 * | 6/2017 | Ralph | H01F 10/3263 |
| 9,768,229 B2 * | 9/2017 | Braganca | G11C 11/1659 |
| 9,916,882 B2 | 3/2018 | Shirotori et al. | |
| 9,929,210 B2 * | 3/2018 | Lai | H01L 27/222 |
| 10,008,248 B2 * | 6/2018 | Buhrman | H01L 29/66984 |
| 10,020,044 B2 * | 7/2018 | Zhao | H01L 27/226 |
| 10,026,465 B2 | 7/2018 | Inokuchi et al. | |
| 10,096,770 B2 * | 10/2018 | Shimizu | H01L 43/12 |
| 10,103,199 B2 | 10/2018 | Daibou et al. | |
| 10,134,457 B1 * | 11/2018 | Mihajlovic | G11C 11/161 |
| 10,224,368 B2 * | 3/2019 | Li | G11C 11/1675 |
| 10,262,711 B2 * | 4/2019 | Ishikawa | G11C 11/1659 |
| 10,276,786 B2 * | 4/2019 | Ohsawa | G11C 11/1675 |
| 10,305,026 B2 | 5/2019 | Apalkov et al. | |
| 10,347,820 B2 * | 7/2019 | Buyandalai | H01L 27/222 |
| 10,347,824 B2 * | 7/2019 | Choi | H01L 27/222 |
| 10,354,709 B2 * | 7/2019 | Wang | H01L 43/08 |
| 10,438,999 B2 * | 10/2019 | Sharma | H01L 29/42392 |
| 10,510,949 B2 * | 12/2019 | Shimizu | H01L 43/12 |
| 10,516,098 B2 * | 12/2019 | Sayed | H01L 43/04 |
| 10,573,363 B2 | 2/2020 | Khvalkovskiy | G11C 11/1675 |
| 10,600,465 B1 * | 3/2020 | Araki | G11C 11/1655 |
| 10,636,962 B2 * | 4/2020 | Park | H01L 43/02 |
| 10,658,021 B1 * | 5/2020 | Araki | G11C 11/18 |
| 2002/0080661 A1 | 6/2002 | Gogl et al. | |
| 2002/0196647 A1 | 12/2002 | Nickel | |
| 2006/0104136 A1 | 5/2006 | Gogl et al. | |
| 2007/0070687 A1 | 3/2007 | Chen et al. | |
| 2007/0297210 A1 | 12/2007 | Ueda | |
| 2011/0157971 A1 | 6/2011 | Kim et al. | |
| 2012/0243304 A1 | 9/2012 | Hoya | |
| 2013/0016551 A1 | 1/2013 | Lombard et al. | |
| 2014/0056061 A1 | 2/2014 | Khvalkovskiy et al. | |
| 2014/0070342 A1 * | 3/2014 | Sandhu | H01L 43/02 |
| | | | 257/421 |
| 2014/0169088 A1 * | 6/2014 | Buhrman | H01F 10/3286 |
| | | | 365/158 |
| 2014/0211552 A1 | 7/2014 | Pi et al. | |
| 2015/0200003 A1 * | 7/2015 | Buhrman | H01L 43/08 |
| | | | 365/158 |
| 2015/0311901 A1 | 10/2015 | Bromberg et al. | |
| 2015/0348606 A1 * | 12/2015 | Buhrman | G11C 11/1675 |
| | | | 365/158 |
| 2016/0079518 A1 | 3/2016 | Pi et al. | |
| 2016/0276006 A1 | 9/2016 | Ralph et al. | |
| 2016/0372174 A1 | 12/2016 | Ohsawa et al. | |
| 2017/0069365 A1 * | 3/2017 | Buhrman | H01L 43/10 |
| 2017/0076769 A1 * | 3/2017 | Shirotori | H01L 43/02 |
| 2017/0076770 A1 | 3/2017 | Daibou et al. | |
| 2017/0117027 A1 * | 4/2017 | Braganca | G11C 11/1675 |
| 2017/0117323 A1 | 4/2017 | Braganca | H01L 43/08 |
| 2017/0141158 A1 * | 5/2017 | Daibou | G11C 11/18 |
| 2017/0148978 A1 | 5/2017 | Apalkov et al. | |
| 2017/0162246 A1 | 6/2017 | Khvalkovskiy et al. | |
| 2017/0178705 A1 | 6/2017 | Buhrman et al. | |
| 2017/0301727 A1 * | 10/2017 | Lai | G11C 11/18 |
| 2017/0365777 A1 | 12/2017 | Mihajlovic et al. | |
| 2018/0033953 A1 | 2/2018 | Sasaki et al. | |
| 2018/0040359 A1 * | 2/2018 | Inokuch | G11C 11/1673 |
| 2018/0040812 A1 * | 2/2018 | Shimizu | H01L 43/08 |
| 2018/0061482 A1 | 3/2018 | Zhao et al. | |
| 2018/0151210 A1 * | 5/2018 | Li | H01L 43/08 |
| 2018/0159024 A1 * | 6/2018 | Buyandalai | H01L 27/228 |
| 2018/0182954 A1 * | 6/2018 | Sayed | H01L 43/08 |
| 2018/0268886 A1 | 9/2018 | Ishikawa et al. | |
| 2018/0277185 A1 * | 9/2018 | Shimizu | G11C 11/1697 |
| 2018/0277746 A1 | 9/2018 | Abe | |
| 2018/0308536 A1 * | 10/2018 | Buhrman | H01L 43/04 |
| 2018/0337326 A1 | 11/2018 | Sasaki | |
| 2018/0351087 A1 | 12/2018 | Choi | |
| 2018/0366172 A1 | 12/2018 | Wang et al. | |
| 2018/0375015 A1 | 12/2018 | Sasaki | |
| 2018/0375016 A1 * | 12/2018 | Shimizu | H01L 27/228 |
| 2019/0006415 A1 | 1/2019 | Li et al. | |
| 2019/0042201 A1 | 2/2019 | Ielmini et al. | |
| 2019/0043572 A1 | 2/2019 | Srinivasan et al. | |
| 2019/0088858 A1 * | 3/2019 | Ohsawa | H01L 27/228 |
| 2019/0102325 A1 | 4/2019 | Natu et al. | |
| 2019/0102568 A1 | 4/2019 | Hausauer et al. | |
| 2019/0103160 A1 | 4/2019 | Fang et al. | |
| 2019/0104083 A1 | 4/2019 | Bernat et al. | |
| 2019/0180173 A1 | 6/2019 | Torng et al. | |
| 2019/0189516 A1 | 6/2019 | Sasaki et al. | |
| 2019/0206938 A1 | 7/2019 | Sharma et al. | |
| 2019/0252601 A1 | 8/2019 | Chatterjee et al. | |
| 2019/0273202 A1 | 9/2019 | Nikitin et al. | |
| 2019/0305042 A1 | 10/2019 | Chen et al. | |
| 2019/0362765 A1 | 11/2019 | Park et al. | |
| 2020/0066968 A1 * | 2/2020 | Park | H01F 10/3286 |
| 2020/0194666 A1 * | 6/2020 | Araki | H01L 43/06 |

FOREIGN PATENT DOCUMENTS

| | | |
|---|---|---|
| WO | WO 2016/011435 A1 | 1/2016 |
| WO | WO2017090733 A1 | 6/2017 |
| WO | WO2017159432 A1 | 9/2017 |

\* cited by examiner

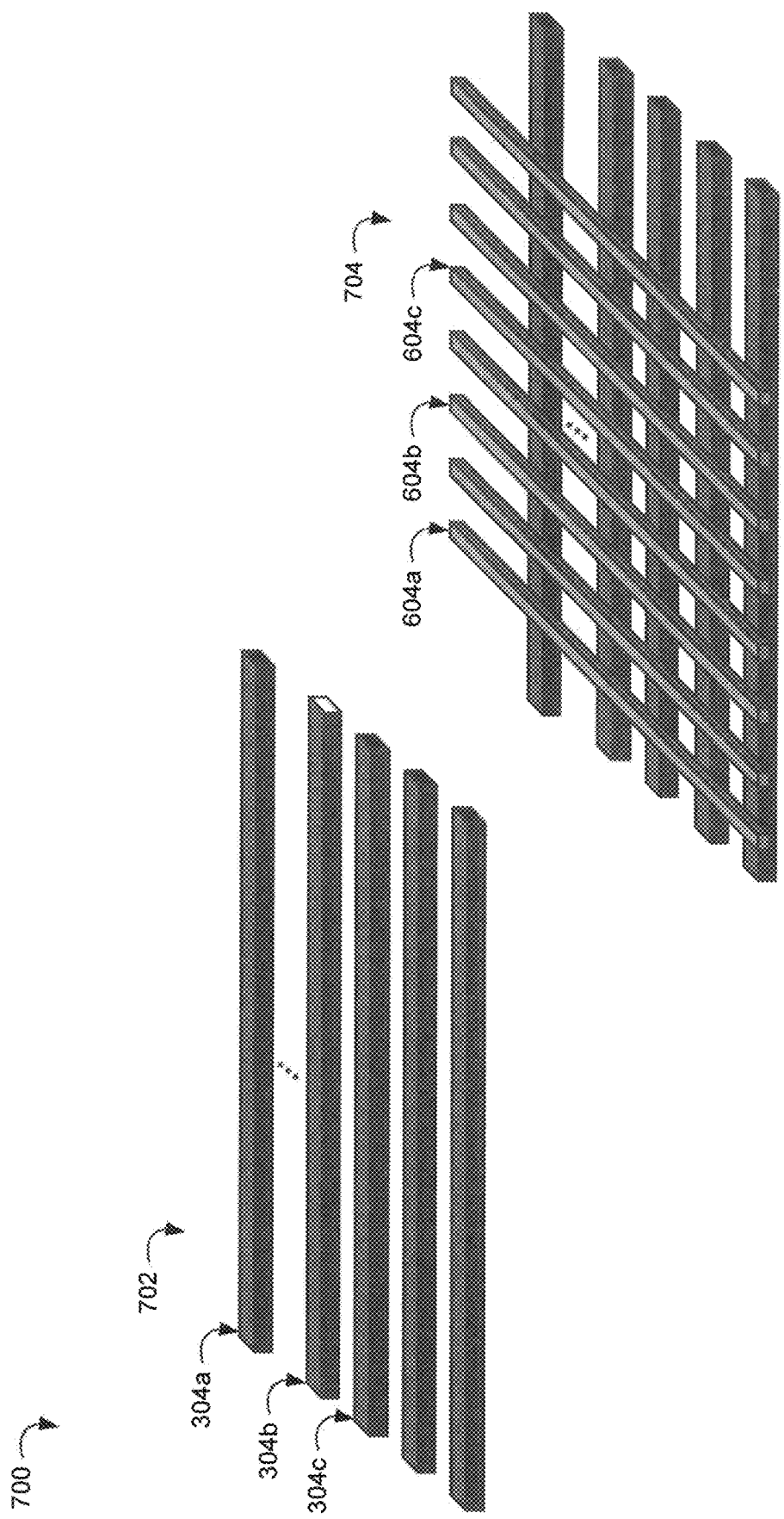

PROCESS FOR MANUFACTURING SCALABLE SPIN-ORBIT TORQUE (SOT) MAGNETIC MEMORY

RELATED APPLICATIONS

This application is related to U.S. patent application Ser. No. 16/223,080 entitled "Spin-Orbit Torque (SOT) Magnetic Memory with Voltage or Current Assisted Switching," filed Dec. 17, 2018; and U.S. patent application Ser. No. 16/223,084 entitled "Scalable Spin-Orbit Torque (SOT) Magnetic Memory," filed Dec. 17, 2018, each of which is hereby incorporated in its entirety.

TECHNICAL FIELD

This relates generally to the field of magnetic memory applications, and more particularly to magnetic memory based on spin-orbit torque (SOT).

BACKGROUND

Magnetoresistive random access memory (MRAM) is a non-volatile memory technology that stores data through magnetic storage elements. MRAM devices store information by changing the orientation of the magnetization of a storage layer. For example, based on whether the storage layer is in a parallel or anti-parallel alignment relative to a reference layer, either a "1" or a "0" can be stored in each MRAM cell.

The field of memory applications is becoming more challenging as the performance requirements for memory-based devices increase. Because of many useful properties of MRAM (e.g., retention of data, resistance to errors, and life span of memory cells), memory systems based on MRAM have superior performance over conventional memory systems.

SUMMARY

There is a need for systems and/or devices with more efficient, accurate, and effective methods for fabricating and/or operating memory systems. Such systems, devices, and methods optionally complement or replace conventional systems, devices, and methods for fabricating and/or operating memory systems.

The present disclosure describes various implementations of MRAM systems and devices.

(A1) A magnetic storage device is provided. The device includes a plurality of first wires extending along a first direction and a plurality of second wires extending along a second direction different from the first direction, forming a grid with the plurality of first wires. The device includes a plurality of spin orbit torque magnetic random access memory (SOT-MRAM) devices, each of the plurality of SOT-MRAM devices disposed at a respective position on the grid. The device includes write circuitry, including a transistor coupled to each respective first wire of the plurality of first wires, to apply a first write current along the respective first wire in the first direction. The device also includes readout circuitry to read a data value stored by a respective SOT-MRAM device.

(A2) In some implementations of (A1), the write circuitry further includes a second transistor to select an individual SOT-MRAM device and apply a second write current to the individual SOT-MRAM device. The second write current is along an axis of the individual SOT-MRAM device.

(A3) In some implementations of any of (A1)-(A2), the first write current applied along the respective first wire in the first direction provides a first magnetic torque to the individual SOT-MRAM device; and the first magnetic torque is below a threshold for switching a magnetic orientation of the individual SOT-MRAM device.

(A4) In some implementations of (A3), the second write current applied along the axis of the individual SOT-MRAM device provides a second magnetic torque to the individual SOT-MRAM device and a sum of the first magnetic torque and the second magnetic torque is above the threshold for switching the magnetic orientation of the individual SOT-MRAM device.

(A5) In some implementations of any of (A1)-(A4), each of the plurality of SOT-MRAM devices comprises a distinct instance of a common set of layers.

(A6) In some implementations of (A5), the common set of layers comprises: a magnetic storage layer, a magnetic reference layer, and a spacing layer separating the magnetic storage layer from the magnetic reference layer. A data value is encoded in a relative magnetic orientation of the magnetic storage layer and the magnetic reference layer.

(A7) In some implementations of (A6), the magnetic storage layer is disposed closer to the respective first wire than the magnetic reference layer is to the respective first wire.

(A8) In some implementations of any of (A6)-(A7), the magnetic storage layer and the magnetic reference layer exhibit a perpendicular magnetic anisotropy.

(A9) In some implementations of any of (A1)-(A8), each first wire is a distinct instance of a layer of a first conductive material.

(A10) In some implementations of any of (A1)-(A9), each second wire is a distinct instance of a layer of a second conductive material.

(A11) In some implementations of any of (A1)-(A10), the plurality of first wires comprise lines and the plurality of second wires comprise lines.

(A12) In some implementations of any of (A1)-(A11), the first direction and the second direction differ by substantially 90 degrees.

(B1) A magnetic storage device is provided. The device includes a first wire extending along a first direction and a plurality of spin orbit torque magnetic random access memory (SOT-MRAM) devices, each of the plurality of SOT-MRAM devices disposed at a respective position along the first wire. The device includes write circuitry, including a first transistor coupled to the first wire to apply a first write current along the first wire in the first direction and a second transistor to select an individual SOT-MRAM device and apply a second write current to the individual SOT-MRAM device concurrently with the application of the first write current. The second write current is along an axis of the individual SOT-MRAM device. The device further includes readout circuitry to read a data value stored by the individual SOT-MRAM device.

(B2) In some implementations of (B1), the first write current applied along the first wire in the first direction provides a first magnetic torque to the individual SOT-MRAM device, and the first magnetic torque from the first write current applied along the first wire in the first direction is below a threshold for switching a magnetic orientation of the individual SOT-MRAM device.

(B3) In some implementations of (B2), the second write current applied along the axis of the individual SOT-MRAM device provides a second magnetic torque to the individual SOT-MRAM device, and a sum of the first magnetic torque and the second magnetic torque is above the threshold for switching the magnetic orientation of the individual SOT-MRAM device.

(B4) In some implementations of (B3), the individual SOT-MRAM device exhibits a voltage-controlled magnetic anisotropy.

(B5) In some implementations of any of (B1)-(B3), each of the plurality of SOT-MRAM devices comprises a distinct instance of a common set of layers.

(B6) In some implementations of (B5), the common set of layers comprises a magnetic storage layer, a magnetic reference layer, and a spacing layer separating the magnetic storage layer from the magnetic reference layer. A data value is encoded in the relative magnetic orientation of the magnetic storage layer and the magnetic reference layer.

(B7) In some implementations of (B6), the magnetic storage layer is disposed closer to the respective first wire than the magnetic reference layer is to the respective first wire.

(B8) In some implementations of any of (B6)-(B7), the magnetic storage layer and the magnetic reference layer exhibit a perpendicular magnetic anisotropy.

(C1) A method of fabricating a magnetic storage device is provided. The method comprises depositing a layer of a first conductive material, electrically isolating a plurality of distinct instances of the layer of the first conductive material to form a plurality of first wires extending along a first direction and depositing, on the plurality of distinct instances of the layer of the first conductive material, a common set of device layers. The method further comprises electrically isolating distinct instances of the common set of device layers to form a plurality of spin orbit torque magnetic random access memory (SOT-MRAM) devices. Each SOT-MRAM device of the plurality of SOT-MRAM devices is positioned on a distinct instance of the layer of the first conductive material. The method further comprises depositing, on the distinct instances of the common set of device layers, a layer of a second conductive material, and electrically isolating a plurality of distinct instances of the layer of the second conductive material to form a plurality of second wires extending along a second direction, wherein the second direction is different from the first direction.

(C2) In some implementations of (C1), electrically isolating the distinct instances of the common set of device layers comprises etching the common set of device layers into lines extending in the second direction.

(C3) In some implementations of (C2), electrically isolating the distinct instances of the common set of device layers further comprises destroying the conductivity of portions of each line without etching the portions of each line to form conductive pillars from each line. Each SOT-MRAM device comprises a conductive pillar.

(C4) In some implementations of (C3), prior to destroying the conductivity of portions of each line without etching the portions of each line, the method includes depositing a protective layer over the line and patterning the protective layer to expose the portions of the line.

(C5) In some implementations of any of (C2)-(C4), each distinct instance of the layer of the second conductive material is coincident with a respective line extending in the second direction.

(C6) In some implementations of any of (C1)-(C2) or (C5), electrically isolating the distinct instances of the common set of device layers comprises etching the common set of device layers into lines extending in the first direction.

(C7) In some implementations of (C6), each distinct instance of the layer of the first conductive material is coincident with a respective line extending in the first direction.

(C8) In some implementations of any of (C2)-(C7), the etching comprises a reactive ion etch (e.g., any of the etching operations described in (C2)-(C7)).

(C9) In some implementations of (C8), the reactive ion etch is based on a carbonyl chemistry.

(C10) In some implementations of any of (C1)-(C9), the common set of device layers is deposited after electrically isolating the plurality of distinct instances of the layer of the first conductive material.

(C11) In some implementations of any of (C1)-(C10), the second layer of conductive material is deposited after electrically isolating the plurality of distinct instances of the layer of the first conductive material.

(C12) In some implementations of any of (C1)-(C11), electrically isolating the plurality of distinct instances of the layer of the first conductive material comprises removing portions of the layer of first conductive material.

(C13) In some implementations of any of (C1)-(C11), electrically isolating the plurality of distinct instances of the layer of the first conductive material comprises destroying the conductivity of portions of the layer of first conductive material without removing the portions of the layer of first conductive material.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

FIGS. 7A-7F graphically illustrate a process for manufacturing an array of SOT-MRAM devices in accordance with some implementations.

DESCRIPTION OF IMPLEMENTATIONS

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

As used herein, the term "torque" means a magnetic torque (e.g., a measure of a tendency to change a direction of a magnetic moment). In some embodiments, a magnetic torque has units of energy.

Figure 1:
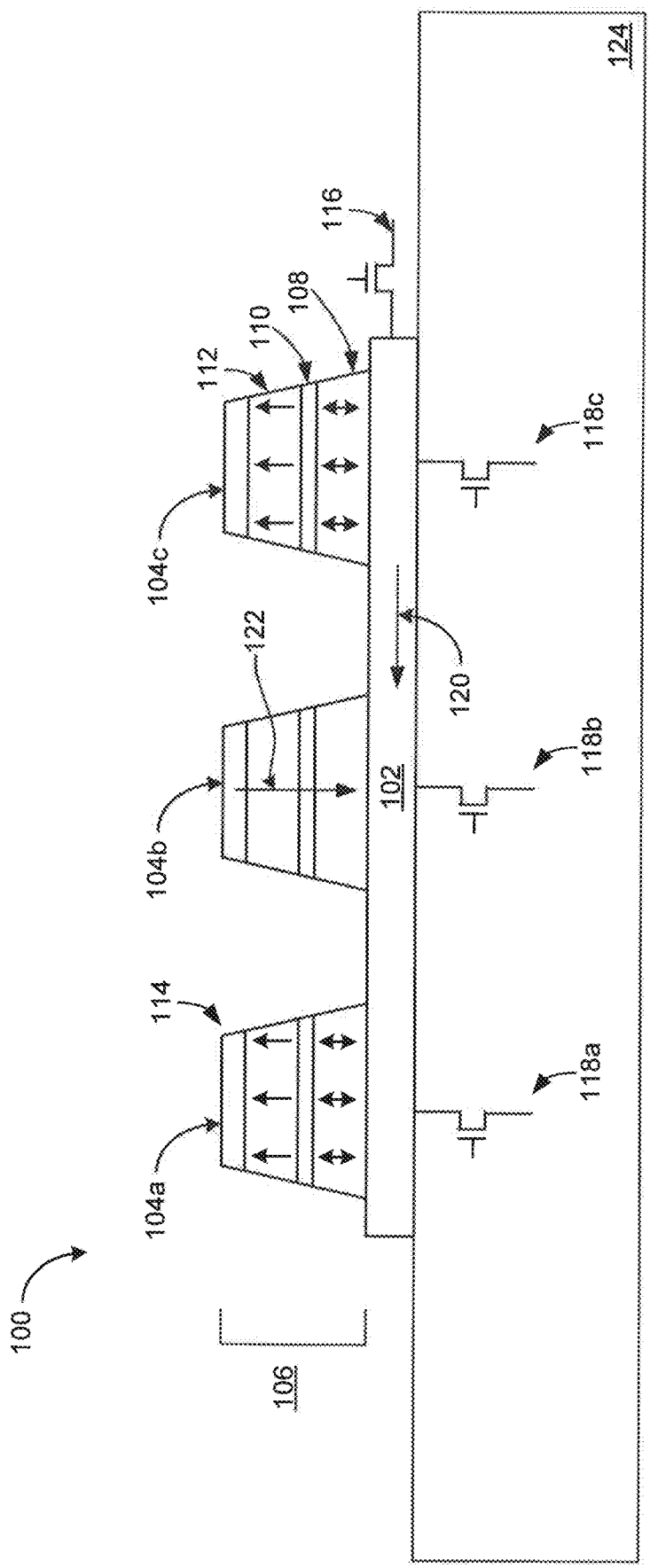
FIG. 1 illustrates a diagram of a magnetic storage device, in accordance with some implementations.

FIG. 1 illustrates a magnetic storage device 100, in accordance with some implementations. In some embodiments, magnetic storage device 100 is a spin orbit torque magnetic storage device that uses spin transfer torque (STT) and/or voltage controlled magnetic anisotropy (VCMA) to assist in reversing magnetizations of storage layers of magnetic bits.

To that end, the device 100 includes a first wire (e.g., an SOT wire) 102 and a plurality of spin orbit torque magnetic random access memory (SOT-MRAM) devices 104 (e.g., devices 104a through 104c) disposed at respective positions along the first wire 102. The first wire 102 extends along a first direction (e.g., a direction along a plane of a substrate 124 upon which device 100 is fabricated).

In some embodiments, SOT-MRAM devices 104 comprise a distinct instances of a common set of layers 106. For example, in some embodiments, distinct instances of a layer are formed by depositing the layer over a portion of a chip and patterning the layer (by etching and/or electrically isolating portions of the layer) to form the distinct instances (as described in greater detail with reference to process 700, FIGS. 7A-7F, and process 800, FIGS. 8A-8B below). In some embodiments, each SOT-MRAM device 104 forms a pillar.

In some embodiments, the common set of layers 106 includes a magnetic storage layer 108, magnetic reference layer 112, and a spacing layer 110 separating the magnetic storage layer from the magnetic reference layer. In some embodiments, the common set of layers 106 includes a top electrode layer 114 (which comprises a conductive material). One or more data values are encoded in the relative magnetic orientation of the magnetic storage layer and the magnetic reference layer. For example, in some embodiments, the magnetic storage layer 108 and the magnetic reference layer 112 exhibit a perpendicular magnetic anisotropy (e.g., each of layer 108/112 exhibits a preferential axis of its respective magnetizations that is perpendicular to the plane of the layer 108/112). In some embodiments, an anti-parallel alignment of the magnetization of the magnetic storage layer with respect to the magnetization of the magnetic reference layer corresponds to a first data value (e.g., a "0" value) and a parallel alignment of the magnetization of the magnetic storage layer with respect to the magnetization of the magnetic reference layer corresponds to a second data value different from the first data value (e.g., a "1" value). In some embodiments, the magnetization of the magnetic reference layer 112 is substantially fixed (e.g., either in the up or down direction).

Note that, in some embodiments, SOT-MRAM device 104b has the same layers, magnetization characteristics, and anisotropies as SOT-MRAM devices 104a and 104c. However, the arrows representing magnetization shown in SOT-MRAM devices 104a and 104c are not shown in SOT-MRAM device 104b as to make room for an arrow representing second write current 122, described below.

In some embodiments, the spacing layer 110 is a tunnel barrier. In some embodiments, the spacing layer 110 comprises an insulating material. In some embodiments, spacing layer 110 comprises a material selected from the group consisting of MgO, SiOx, AlOx, or an alloy thereof. In some embodiments, spacing layer 110 has a thickness of 0.2 to 2 nanometers (nm), which may depend on a target resistance. In some embodiments, the spacing layer 110 is deposited using a sputtering methodology (e.g., from either a MgO sintered target or by sputtering Mg metal and allowing it to oxidize).

In some embodiments, the magnetic storage layer 108 (also sometimes called a "free layer") includes a plurality of sub-layers (e.g., individually deposited sub-layers). In some embodiments, the sub-layers include a metal buffer layer that serves as a perpendicular magnetic anisotropy (PMA) enhancer. In some embodiments, the sub-layers include one or more sub-layers comprising a material selected from the group consisting of Ta, Cr, W, V, Mo, Pt, Ru, Pd, Cu, Ag, Rh, or an alloy thereof. In some embodiments, the magnetic storage layer 108 has a thickness of 1 to 10 nm, and preferably 1 to 5 nm.

In some embodiments, the magnetic reference layer 112 (also sometimes called a "fixed layer") includes a plurality of sub-layers (e.g., individually deposited sub-layers). In some embodiments, the sub-layers include one or more sub-layers comprising a material of the group consisting of CoFeB, CoFe, CoFeNi, FeNi, FeB, or an alloy thereof. In some embodiments, the sub-layers include a plurality of Co/(Pt, Pd) multilayers. In some embodiments, the sub-layers include one or more sub-layers comprising a Heusler Alloy (e.g., a material selected from the group consisting of CoMnSi, CoMnGe, CoMnAl, CoMnFeSi, CoFeSi, CoFeAl, CoCrFeAl, CoFeAlSi). In some embodiments, the sub-layers include a capping layer as a PMA Enhancer. In some embodiments, the capping layer comprises a material selected from the group consisting of Ta, Cr, W, V, Pt, Ru, Pd, Cu, Ag, Rh, or an alloy thereof. In some embodiments, the capping layer comprises MgO. In some embodiments, the capping layer has a thickness in the range of 1 to 10 nm. In some embodiments, the magnetic reference layer 112 has a thickness (e.g., in total) in the range of 1 to 20 nm, preferably 1 to 10 nm, more preferably 1 to 5 nm.

In some embodiments, the first wire 102 comprises a first conductive material. In some embodiments, the first wire 102 comprises a material exhibiting a strong spin Hall effect (SHE). In some embodiments, the first wire 102 comprises a heavy metal. In some embodiments, the first wire 102 comprises Pt, Ta, W, or an alloy thereof. In some embodiments, the first wire 102 has a thickness in a range of 2 to 100 nm, preferably 5 to 80 nm, and more preferably from 8 to 50 nm. In some embodiments, the thickness depends on a target resistance.

The device 100 further includes write circuitry. In some embodiments, the write circuitry is configured to set the relative magnetic orientations of the magnetic storage layer 108 and the magnetic reference layer 112 (e.g., by setting the direction of the magnetic orientation of the magnetic storage layer). The write circuitry includes a first transistor 116 coupled to the first wire 102 to apply a first write current 120 along the first wire in the first direction (e.g., a direction along a plane of a substrate 124). The write circuitry also includes a second transistor 118 to select an individual SOT-MRAM device 104 (e.g., a single SOT-MRAM device) and apply a second write current 122 to the individual SOT-MRAM device concurrently with the application of the first write current 120. The second write current is along an axis of the individual SOT-MRAM device (e.g., an axis perpendicular to the layers and along the same direction as the magnetization of the magnetic layers, e.g., the second write current is perpendicular to the first write current). For example, second transistor 118a activates SOT-MRAM device 104a (e.g., applies a perpendicular current to SOT- MRAM device 104*a*); second transistor 118*b* activates SOT-MRAM device 104*b* (e.g., applies a perpendicular current to SOT-MRAM device 104*b*); and second transistor 118*c* activates SOT-MRAM device 104*c* (e.g., applies a perpendicular current to SOT-MRAM device 104*c*). In some embodiments, the second transistors 118 are fabricated underneath SOT-MRAM devices 104 (e.g. are fabricated closer to and/or partially within a substrate 124 upon which SOT-MRAM devices 104 are fabricated). In some embodiments, the second transistors 118 are fabricated directly underneath SOT-MRAM devices 104 (e.g., so that there is at least some overlap between an SOT-MRAM device 104 and its corresponding second transistor 118).

In some embodiments, as described in greater detail below with reference to FIG. 2, the first write current 120 applied along the first wire 102 in the first direction provides a first magnetic torque to the individual SOT-MRAM device 104. In some embodiments, the first write current 120 applies a magnetic torque to each of the plurality of SOT-MRAM devices 104 disposed along the first wire 102. In some embodiments, the first magnetic torque from the first write current 120 applied along the first wire 102 in the first direction is below a threshold for switching a magnetic orientation of the individual SOT-MRAM device (e.g., is insufficient to switch the relative magnetic orientation from parallel to anti-parallel or from anti-parallel or parallel). In some embodiments, the first torque is in a range of 70-90% of the threshold.

In some embodiments, the second write current 122 applied along the axis of the individual SOT-MRAM device 104 provides a second magnetic torque to the individual SOT-MRAM device 104. In some embodiments, the second magnetic torque from the second write current 122 is below a threshold for switching a magnetic orientation of the individual SOT-MRAM device (e.g., is insufficient to switch the relative magnetic orientation from parallel to anti-parallel or from anti-parallel or parallel). However, a sum of the first magnetic torque and the second magnetic torque is above the threshold for switching the magnetic orientation of the individual SOT-MRAM device 104. For example, during a write operation to set a data value of SOT-MRAM device 104*b*, the first write current 120 is applied along the first wire 102 (e.g., which provides a magnetic torque to each of the SOT-MRAM devices 104) and the second write current 122 is applied along SOT-MRAM device 104*b* individually (e.g., by activating transistor 118*b*, e.g., without applying a write current perpendicular to the other SOT-MRAM devices 104). Since the net sum of the magnetic torques from the first write current 120 and the second write current 122 are above the threshold for switching the magnetic orientation of SOT-MRAM device 104*b*, the magnetic orientation of SOT-MRAM device 104*b* is switched under the two currents. However, since the remaining SOT-MRAM devices 104 are subject only to the first write current 120, which has a corresponding magnetic torque below the threshold, the remaining SOT-MRAM devices 104 are not switched. Thus, FIG. 1 provides a magnetic storage device in which the SOT-MRAM devices 104 are individually addressable.

Thus, in some embodiments, during a write operation, the first write current 120 applies a SOT torque to a plurality of SOT-MRAM devices. The second write current 122 applies a magnetic torque to a subset, less than all, of the plurality of SOT-MRAM devices. The subset, less than all, of the SOT-MRAM devices are written in the write operation, and the remaining SOT-MRAM devices of the plurality of the SOT-MRAM devices are not written in the write operation.

Device 100 includes readout circuitry to read a data value stored by the individual SOT-MRAM device 104. In some embodiments, the readout circuitry is configured to read a data value without changing the magnetizations of any of the layers. In some embodiments, readout circuitry also includes second transistors 118. For example, during a read operation of a respective SOT-MRAM device 104, a small current (e.g., smaller than second current 122 applied during write operations) is applied perpendicular to the respective SOT-MRAM device 104. The small current is used to detect a resistance of the respective SOT-MRAM device 104, which is used to determine the data value stored by the respective SOT-MRAM device 104 (e.g., due to the magnetoresistance, a parallel arrangement of the magnetizations of magnetic storage layer 108 and magnetic reference layer 112 has a different resistance than an anti-parallel arrangement of the same).

Note that the first write current 120 and the second write current 122 apply magnetic torques based on different physical phenomena. In some embodiments, the first write current 120 applies a spin-orbit torque and the second write current 122 applies a spin transfer torque. Because spin orbit torques act at short distances from an appropriately selected wire, in some embodiments, the magnetic storage layer 108 is disposed closer to the first wire 102 than the magnetic reference layer 112 is to the first wire 102 (e.g., magnetic storage layer 108 is adjacent to the first wire 102, with the possible exception of optional thin layers (e.g., layers less than a nanometer in thickness), such as sticking layers and other layers included for fabrication purposes).

In some embodiments, the second write current 122 is applied by application of a voltage between top electrode 114 on the respective SOT-MRAM device 104 and the second transistor 118 corresponding to the respective SOT-MRAM device 104. In some circumstances, the effects of the voltage are multimodal. For example, in some embodiments, the respective SOT-MRAM device 104 exhibits a voltage-controlled magnetic anisotropy (e.g., the magnetic storage layer exhibits a voltage-controlled magnetic anisotropy). This has the effect of lowering the switching threshold for the respective SOT-MRAM device 104 without lowering the switching threshold for the other SOT-MRAM devices 104, which acts in tandem with a spin transfer torque from the second write current 122. The effect of the spin orbit torque from the first write current 120, the spin transfer torque from the second write current 122, and the reduced threshold are sufficient to switch the respective SOT-MRAM device 104 without switching the remaining SOT-MRAM devices 104.

It should also be noted that, in some embodiments, rather than writing a single SOT-MRAM device 104 in a respective write operation, a plurality (fewer than all) of the SOT-MRAM device 104 disposed on first wire 102 are written in a write operation. To that end, the first write current 120 is applied along the first wire 102, and second write currents 122 are applied to each of the SOT-MRAM devices 104 being written (e.g., by activation of the corresponding second transistor 118). No perpendicular current is applied to the SOT-MRAM devices 104 that are not being written.

Figure 2:
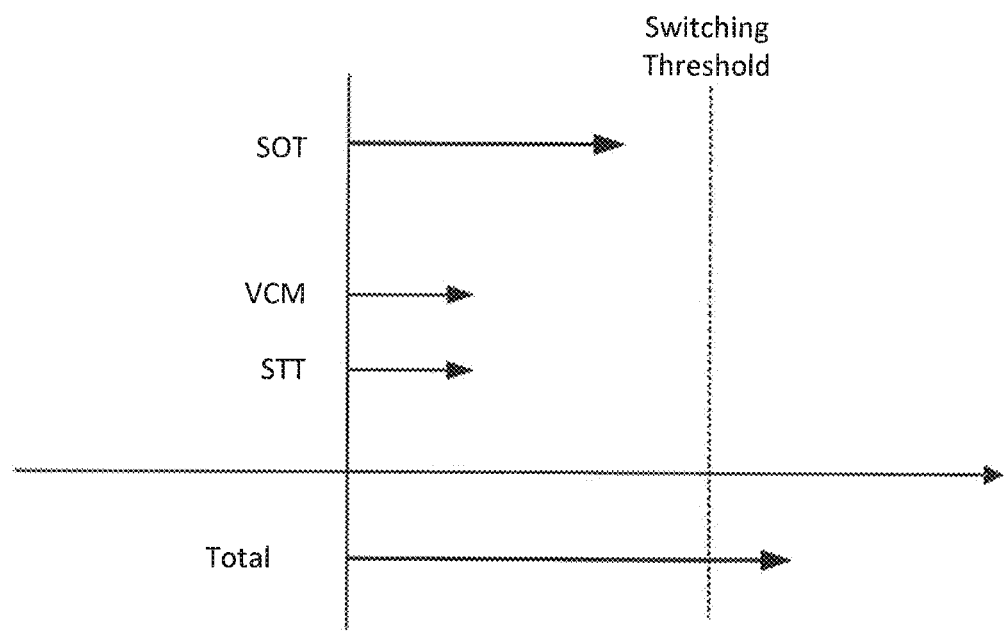
FIG. 2 illustrates the effects of different magnetic torques applied in a write operation with respect to switching threshold for the device shown in FIG. 1, in accordance with some implementations.

FIG. 2 illustrates the effects of different magnetic torques applied in a write operation with respect to switching threshold for the device shown in FIG. 1, in accordance with some implementations.

As noted above, device 100 writes data values to individual SOT-MRAM devices 104 using spin transfer torque and/or voltage controlled magnetic anisotropy (VCMA) to assist spin orbit torque, which in some embodiments constitutes the main effect (e.g., the majority of the torque on the free layer of the SOT-MRAM device 104). To that end, FIG. 2 illustrates that the SOT torque is less than the threshold for switching a bit. In some embodiments, the SOT torque is between 70-90% of the threshold for switching a bit. In addition, a VCMA effect (which can be viewed as lowering the threshold, or equivalently, as its own torque) is less than the threshold and less than the effect of the SOT torque (e.g., the VCMA is equivalent to providing a torque that is 10-50% of the threshold). In some embodiments, an STT torque is less than the threshold and less than the SOT torque (e.g., the STT torque is between 10-50% of the threshold).

In addition, the different effects (SOT, STT, and VCMA) give rise to different switching times. For example, devices based solely on SOT torque have switching times on the order of 0.7 nanoseconds (ns). Devices based on VCMA have switching times on the order of 2.1 ns. Devices based on STT have switching times on the order of 7.8 ns. However, by using primarily SOT with a small amount of STT and/or VCMA assistance, as described with reference to FIG. 1, the devices described herein can be made to switch on the order of 1.1 ns, very close to that of SOT alone. Thus, the described embodiments benefit from the fast switching of SOT devices, but allow such devices to be individually addressed using SOT/VCMA assistance, as described above with reference to FIG. 1.

Figure 3:
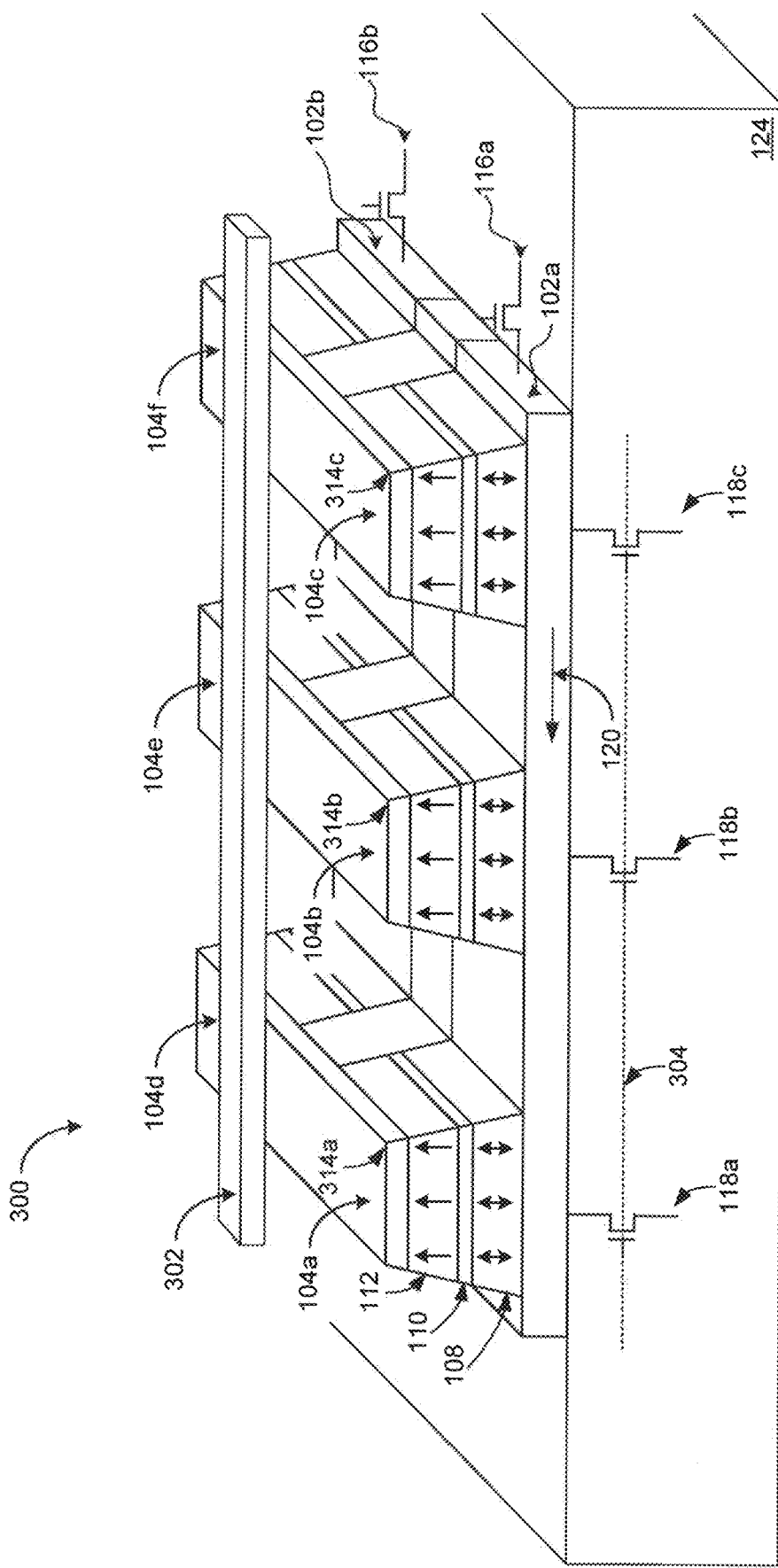
FIG. 3 illustrates a diagram of a magnetic storage device, in accordance with some implementations.

FIG. 3 illustrates a diagram of a magnetic storage device 300, in accordance with some implementations. In some embodiments, magnetic storage device 300 is an MRAM array (e.g., analogous to the MRAM arrays 502 shown in FIG. 5). Various aspects of magnetic storage device 300 are analogous to those described above with reference to magnetic storage device 100, FIG. 1. For brevity, those details are not repeated here. For examples, features of magnetic storage device 300 that are given the same reference number as similar features of magnetic storage device 100 may share any of the characteristics of those features described above.

To that end, magnetic storage device 300 includes a plurality of first wires 102. For example, magnetic storage device 300 includes two first wires 102 (e.g., first wires 102a and 102b), although it should be understood that in some embodiments, magnetic storage device 300 may include dozens or hundreds of first wires 102. In some embodiments, the first wires 102 are SOT wires exhibiting a strong spin Hall effect. The first wires 102 extend along a first direction (e.g., in the plane of a substrate 124 upon which magnetic storage device 300 is fabricated). For example, each respective first wire 102 of the plurality of first wires 102 has a first end and a second end and the first direction goes from the first end toward the second end.

Magnetic storage device 300 includes a plurality of second wires 314 extending along a second direction different from the first direction. For example, magnetic storage device 300 includes three second wires 314 (e.g., second wires 314a through 314c), although it should be understood that, in some embodiments, magnetic storage device 300 includes dozens or hundreds of second wires 314 (e.g., in a single MRAM array 502, as described with respect to FIG. 5). The plurality of second wires 314 forms a grid (e.g., a matrix) with the plurality of first wires 102. For example, at respective position on the grid, a respective second wire 314 overlaps with a respective first wire 102. In some embodiments, the first direction and the second direction differ by substantially 90 degrees (e.g., the first wires 102 and the second wires 314 form a rectangular "x-y" matrix).

Magnetic storage device 300 includes a plurality of spin orbit torque magnetic random access memory (SOT-MRAM) devices 104. For example, as shown in FIG. 3, magnetic storage device 300 includes SOT-MRAM devices 104a through 104f. Each of the plurality of SOT-MRAM devices 104 is disposed at a respective position on the grid. In some embodiments, each SOT-MRAM device 104 is a pillar formed between a respective first wire 102 and a respective second wire 314 at a location that the respective first wire 102 and the second wire 314 overlap, such that an axis of the SOT-MRAM device 104 extends from the respective first wire 102 to the respective second wire 314. For example, SOT-MRAM device 104b is a pillar formed between a first wire 102a and a second wire 314b at a location that the first wire 102a and the second wire 314b overlap, such that an axis of the SOT-MRAM device 104b extends from the first wire 102a to the respective second wire 314b (e.g., perpendicularly to the substrate 124).

Note that, as used herein, the term "pillar" does not imply a circular cross-section, ellipsoidal cross-section, or any other shape of cross-section. Rather, a pillar simply implies a vertical structure (e.g., with respect to a substrate). In some embodiments, a pillar is a tall vertical structure (e.g., taller than it is wide). Furthermore, in some embodiments, a pillar is formed by depositing layers on a substrate and patterning the layers. In some circumstances, the patterning includes electrically isolating pillars (e.g., via ion-bombardment to destroy conductivity) without physically removing material. Thus, in some embodiments, a pillar is a vertical conductive pathway.

Magnetic storage device 300 includes write circuitry. The write circuitry includes a first transistor 116 coupled to each respective first wire 102 of the plurality of first wires 102. For example, first transistor 116a is coupled to first wire 102a and first transistor 116b is coupled to first wire 102b. The first transistors 116 are configured to apply a first write current 120 along the respective first wire 102 in the first direction (e.g., from a first end of the respective first wire 102 toward a second end of the respective first wire 102). For example, in some embodiments, a respective first wire 102 is selected by activating the corresponding transistor 116, which applies a first write current 110 to the first wire 102.

In some embodiments, the write circuitry further includes a second transistor 118 to select an individual SOT-MRAM device 104 (e.g., a single SOT-MRAM device) and apply a second write current 122 (FIG. 1) to the individual SOT-MRAM device 104. As noted above, the second write current 122 is along an axis of the individual SOT-MRAM device 104. In some embodiments, the write circuitry includes a second transistor 118 for each individual SOT-MRAM device 104 (e.g., the write circuitry includes a plurality of second transistors 118). In some embodiments, the second transistors are disposed underneath the SOT-MRAM devices.

In some embodiments, each second transistor 118 is a field effect transistor (FET) having a gate, source, and drain. In some embodiments, the gate of each second transistor 118 along a respective row of second transistors 118 (e.g., a row of the grid) is connected to the same word line 304. The source (or drain) of each second transistor along a respective column of second transistors is connected to the same bit line (not shown). Thus, an individual SOT-MRAM device 104 is selectable by, for example, activating the gate (using the word line) and pulling the voltage on the source line to an appropriate level to cause a voltage difference across the individual SOT-MRAM device 104.

In some embodiments, the write circuitry further includes a bit line 302. In some embodiments, the bit line 302 is activated (e.g., a voltage is applied on the bit line 302) to activate magnetic storage device 300 as a whole. The transistors 116/118 are then used to address one or more individual SOT-MRAM devices 104.

Magnetic storage device 300 further includes readout circuitry to read a data value stored by a respective SOT-MRAM device 104. The readout circuitry is analogous to what is described with reference to FIG. 1. For example, in some embodiments, the readout circuitry includes second transistors 118. Data values are read out by activating a respective second transistor 118 to select a respective SOT-MRAM device 104 and measuring a resistance of the SOT-MRAM device 104 (e.g., between the bit line 302 and the respective second transistor 118).

As described above with reference to FIG. 1, in some embodiments, the first write current 120 applied along the respective first wire 102 in the first direction provides a first magnetic torque to an individual SOT-MRAM device 104. In some embodiments, the write current applied along the respective first wire 102 in the first direction provides a magnetic torque to two or more SOT-MRAM devices 104 (e.g., all of the devices along the first wire 102). The first magnetic torque is below a threshold for switching a magnetic orientation of the individual SOT-MRAM device 104.

The second write current 122 applied along the axis of the individual SOT-MRAM device 104 provides a second magnetic torque to the individual SOT-MRAM device 104. A sum of the first magnetic torque and the second magnetic torque is above the threshold for switching the magnetic orientation of the individual SOT-MRAM device 104. In some embodiments, the individual SOT-MRAM device 104 exhibits a voltage controlled magnetic anisotropy that lowers the threshold for switching the magnetic orientation of individual SOT-MRAM device 104 when the second write current 122 is applied (and thus a voltage is applied) along the axis of the individual SOT-MRAM device 104.

In some embodiments, each of the plurality of SOT-MRAM devices comprises a distinct instance of the common set of layers 106 described above with reference to FIG. 1, including magnetic storage layer 108; magnetic reference layer 112, and spacing layer 110 separating the magnetic storage layer from the magnetic reference layer. A data value is encoded in a relative magnetic orientation of the magnetic storage layer and the magnetic reference layer.

In some embodiments, each first wire 102 is a distinct instance of a layer of a first conductive material. In some embodiments, the first conductive material comprises any of the conductive materials described for the first wire 102 with reference to FIG. 1.

In some embodiments, each second wire is a distinct instance of a layer of a second conductive material. In some embodiments, the second conductive material comprises Cu, Au, Ag, or an alloy thereof.

In some embodiments, the plurality of first wires 102 comprise lines (e.g., straight lines). In some embodiments, the plurality of second wires 314 comprise lines (e.g., straight lines). In some embodiments, as described below with reference to method 800, the SOT-MRAM devices of magnetic storage device 300 can be fabricated in a grid (e.g., a matrix) entirely, or nearly entirely, using lined lithography masks (e.g., rather than more complex shapes). When combined with the etching techniques described herein, this structure can reach a pitch on the order of 2-4 F, with 2-3 F bit-to-bit separation, and very high bit densities of 4-12 $F^2$.

Figure 4:
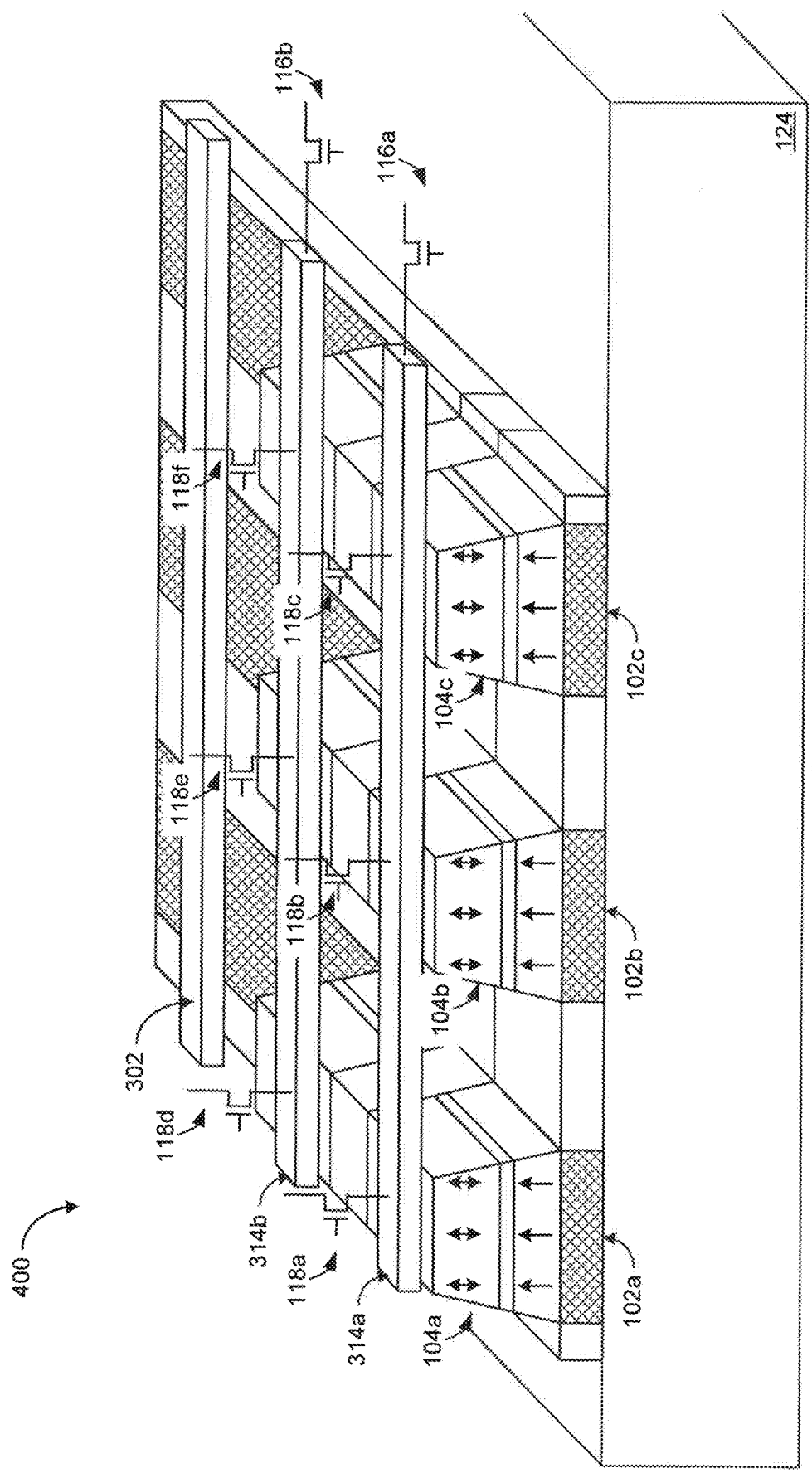
FIG. 4 illustrates a diagram of a magnetic storage device, in accordance with some implementations.

FIG. 4 illustrates a diagram of a magnetic storage device 400, in accordance with some implementations. In particular, magnetic storage device 400 is analogous to magnetic storage device 300 (FIG. 3), except that first wires 102 (e.g., SOT wires) are disposed above the SOT-MRAM devices 104 (e.g., relative to the substrate 124). Because the magnetic storage layer should generally be disposed closer to the first wire 102 (e.g., the SOT wire) than the magnetic reference layer (e.g., the magnetic storage layer is adjacent to the SOT wire), the SOT-MRAM devices 104 in magnetic storage device 400 are essentially flipped over, as compared to those of magnetic storage device 300. That is, in magnetic storage device 400, the magnetic reference layer is disposed closer to the substrate than the magnetic storage layer.

Another difference between magnetic storage device 400 and magnetic storage device 300 is that the bit line 302 for the magnetic storage device 400 is disposed laterally from the SOT-MRAM device 104, as opposed to on top of the SOT-MRAM devices 104, as was the case with magnetic storage device 300.

For visual clarity, the word lines and source lines are not shown in FIG. 4.

Figure 5:
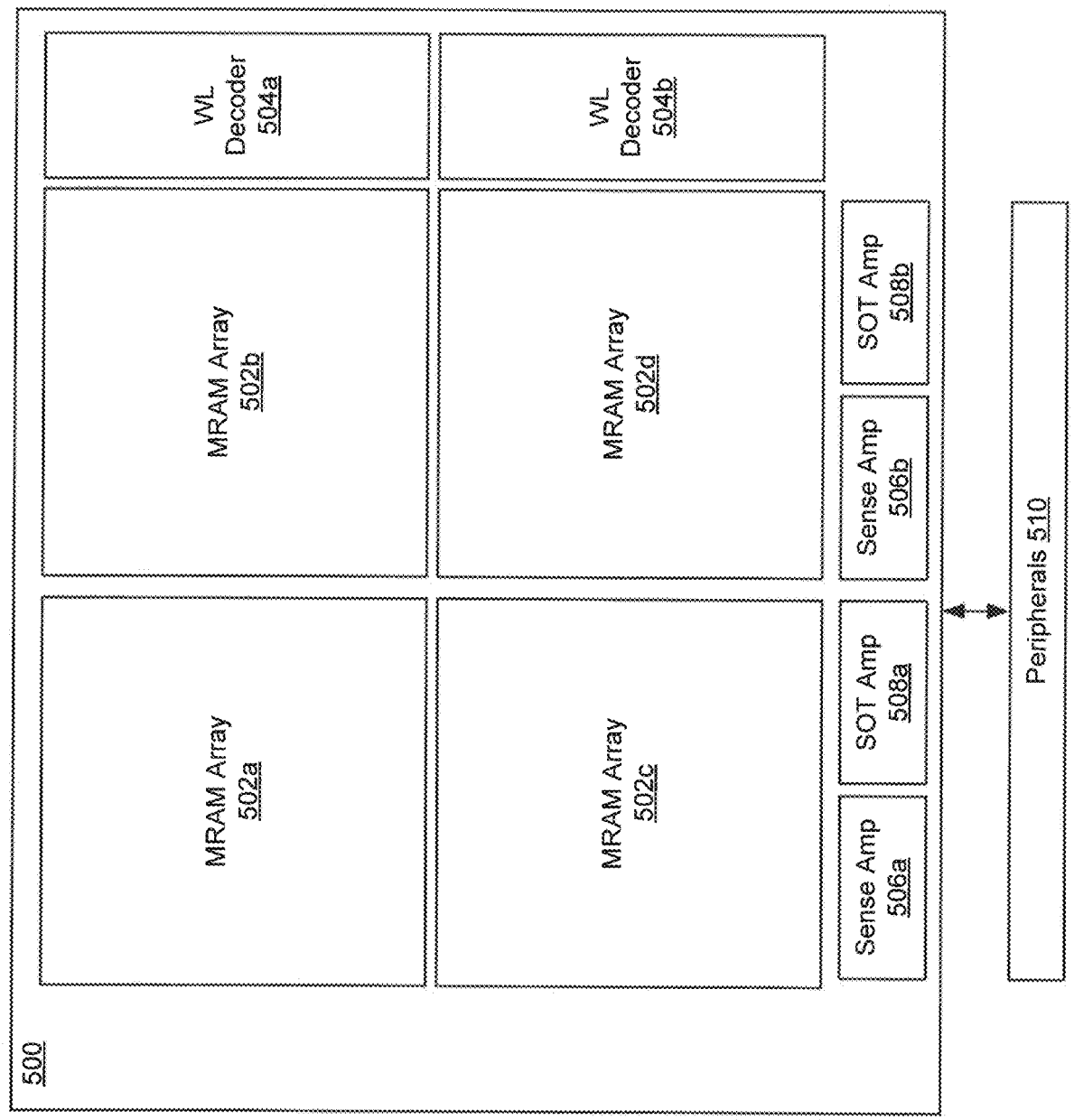
FIG. 5 illustrates a block diagram of a magnetic storage device, in accordance with some implementations.

FIG. 5 illustrates a block diagram of a magnetic storage device 500, in accordance with some implementations. In some embodiments, magnetic storage device 500 is formed on a single die.

In some embodiments, the magnetic storage device 500 includes a plurality of MRAM arrays 502 (e.g., MRAM arrays 502a-502d). In some embodiments, each MRAM array 502 is an instance of a magnetic storage device 300, FIG. 3 or a magnetic storage device 400, FIG. 4. In some embodiments, the MRAM arrays 502 are formed into rows and columns.

In some embodiments, the magnetic storage device 500 includes word line (WL) decoders 504. For example, magnetic storage device 500 includes a word line decoder 504 for each row of MRAM arrays 502. In some embodiments, word line decoders 504 are part of the read circuitry of the magnetic storage device 500.

In some embodiments, the magnetic storage device 500 includes an SOT amplifier 508 for each column of MRAM arrays 502. The SOT amplifiers 508 provide an amplified current (e.g., first current 120, FIG. 1) that is applied to the first wires 102, shown in FIG. 3. In some embodiments, the SOT amplifiers 508 are part of the write circuitry of the magnetic storage device 500.

In some embodiments, the magnetic storage device 500 includes a sense amplifier 506 for each column of MRAM arrays 502. The sense amplifiers 506 amplify a read signal (e.g., based on a magnetoresistance) of an SOT-MRAM device 104 that is being read.

In some embodiments, the magnetic storage device 500 is coupled with one or more peripheral devices 510, such as a memory controller, processor, or the like.

Figure 6:
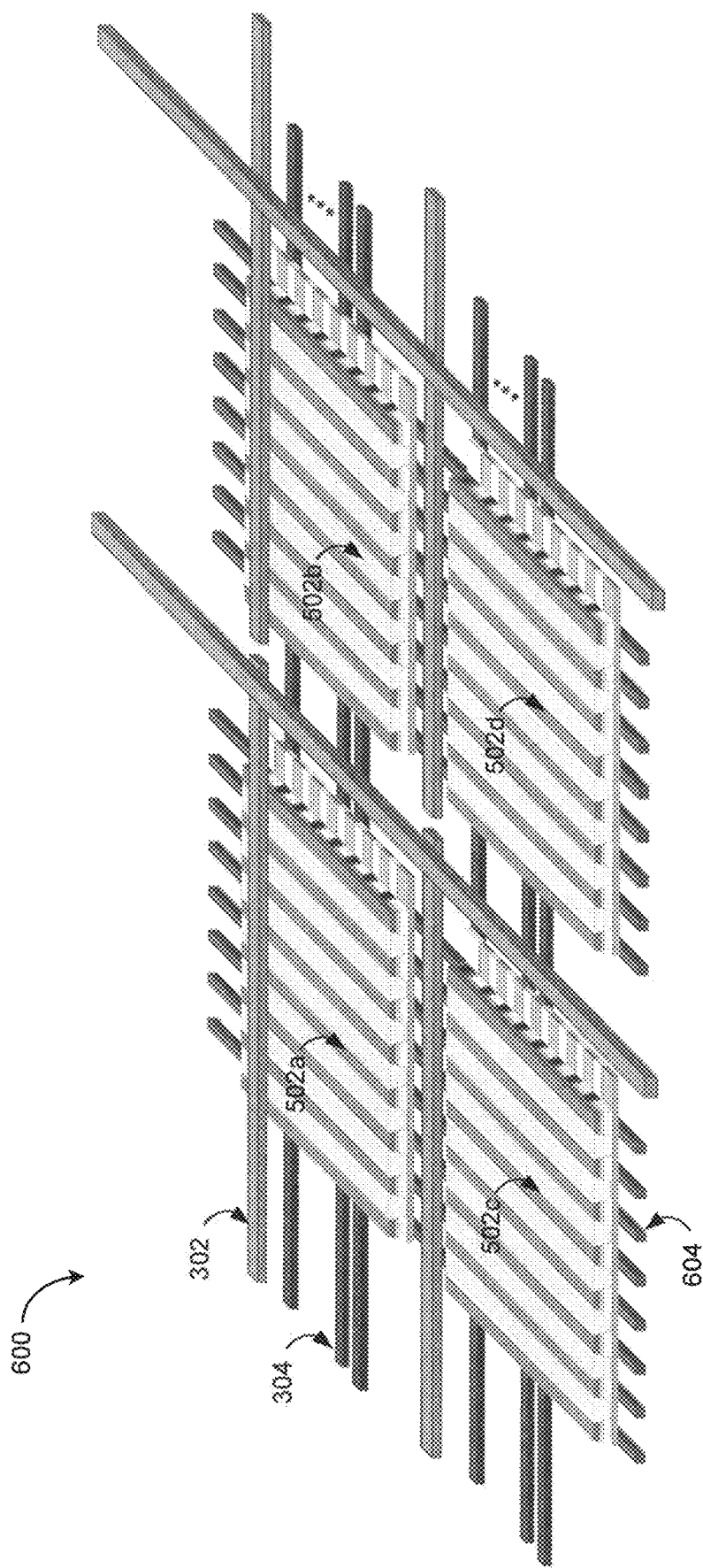
FIG. 6 illustrates a schematic diagram of a magnetic storage device, in accordance with some implementations.

FIG. 6 illustrates a schematic diagram of magnetic storage device 600, in accordance with some implementations. The magnetic storage device 600 includes MRAM arrays 502 (e.g., as described with reference to FIG. 5). Magnetic storage device 600 further includes a plurality of bit lines 302. Each bit line is used to activate (e.g., select) an individual MRAM array 502 (e.g., for a read or a write operation). The magnetic storage device 600 includes word lines 304 and source lines 604 that are used to activate (e.g., select) an individual SOT-MRAM device in a respective MRAM array 502, as described elsewhere in this document.

Figure 7B:
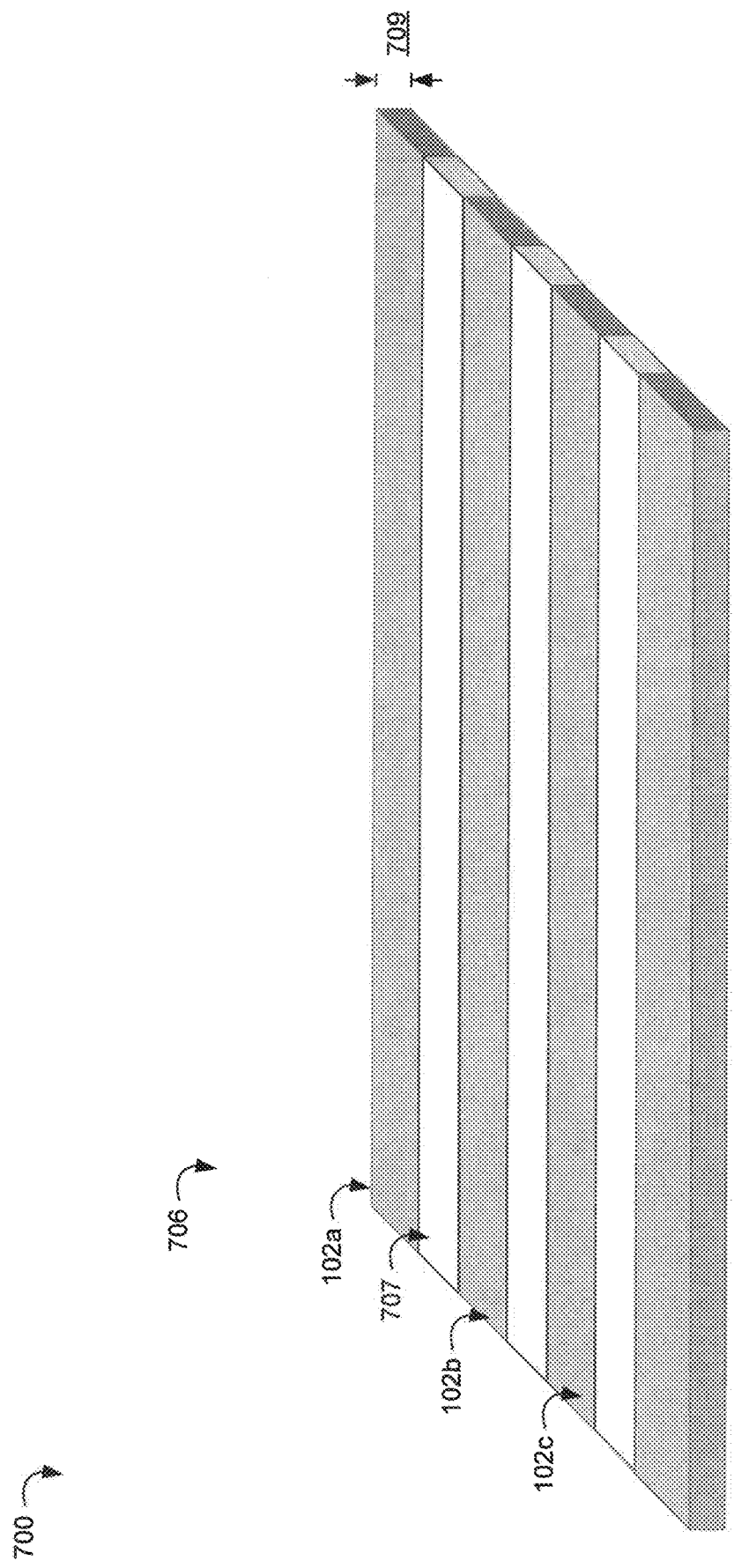
Figure 7C:
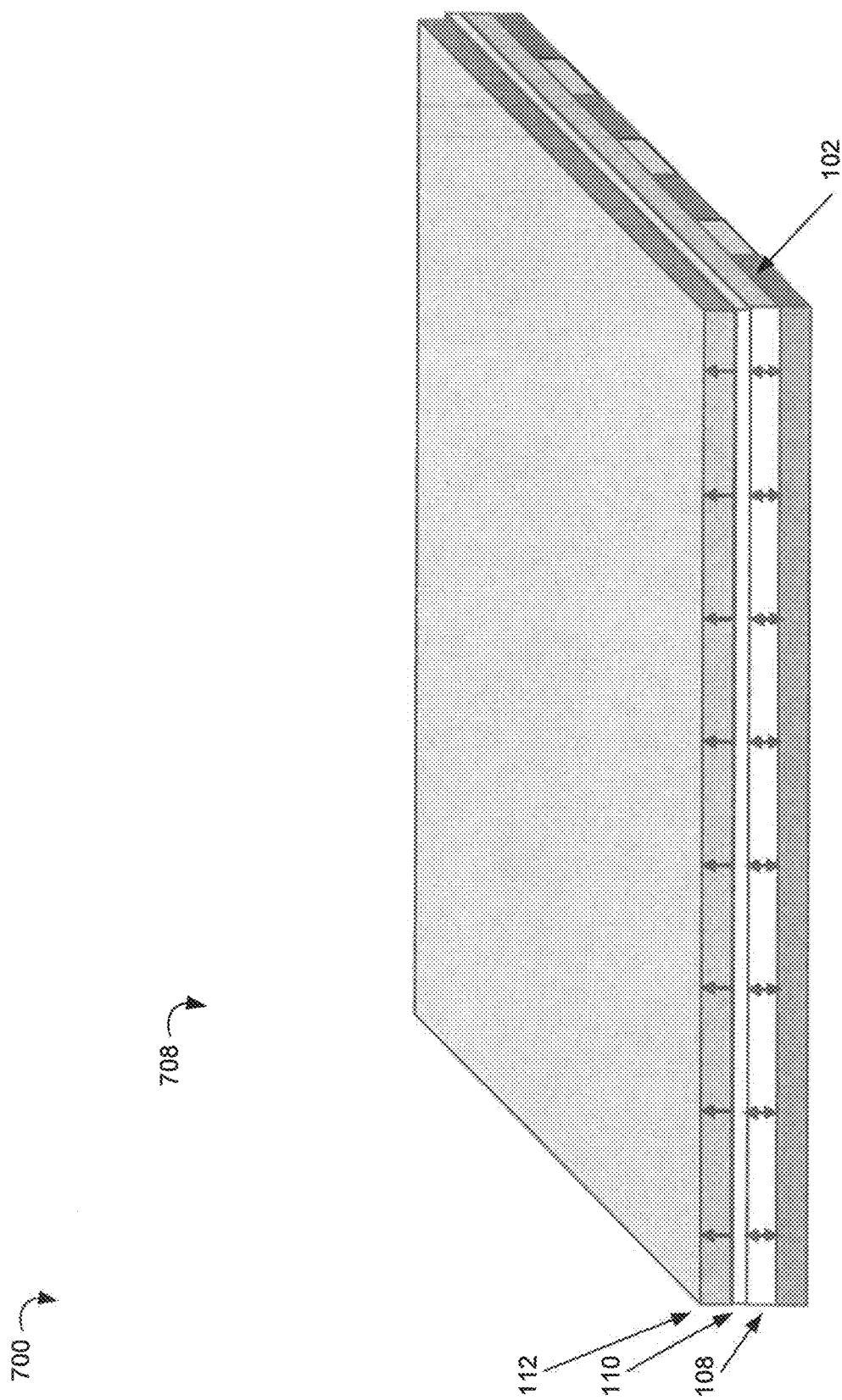
Figure 7D:
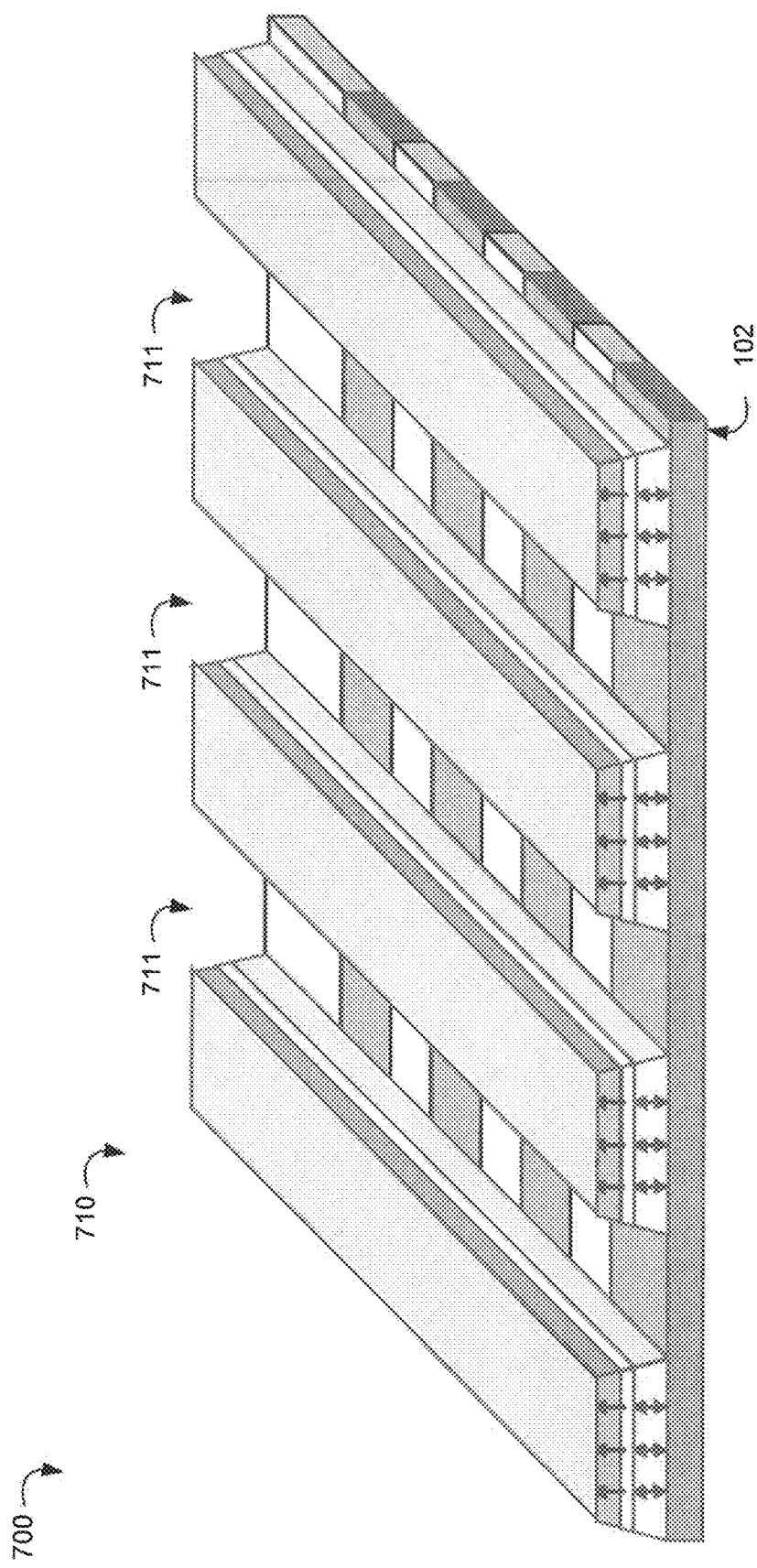
Figure 7E:
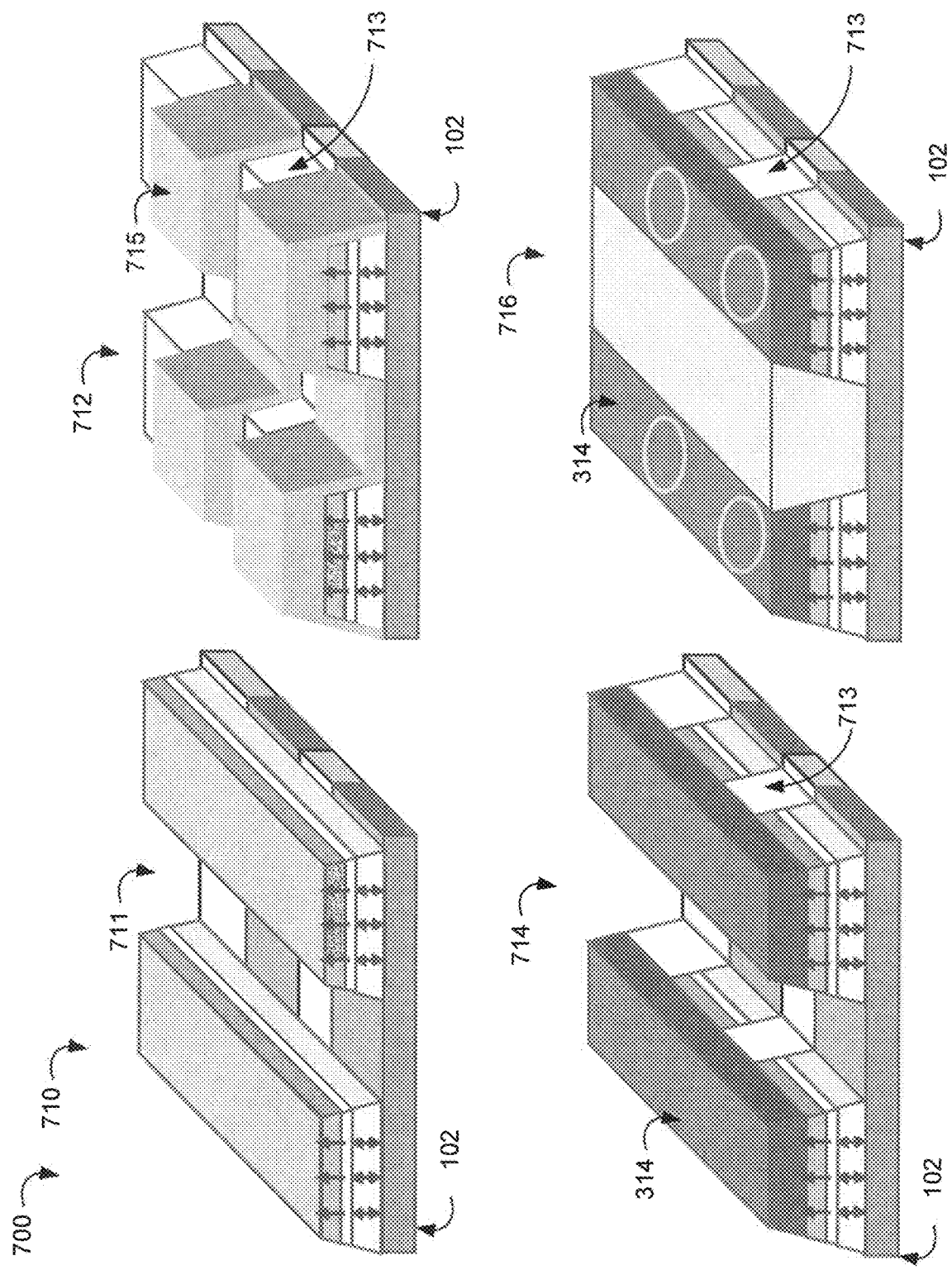
Figure 7F:
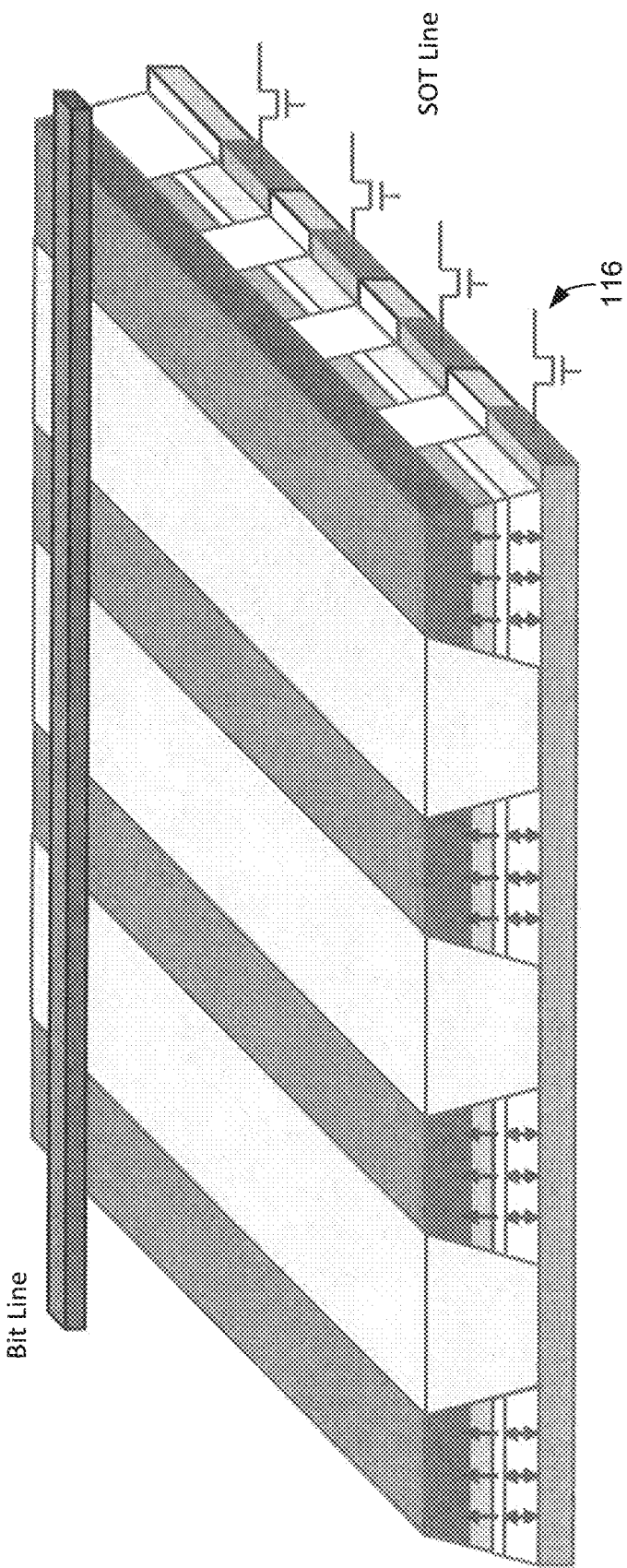
Figure 8A:
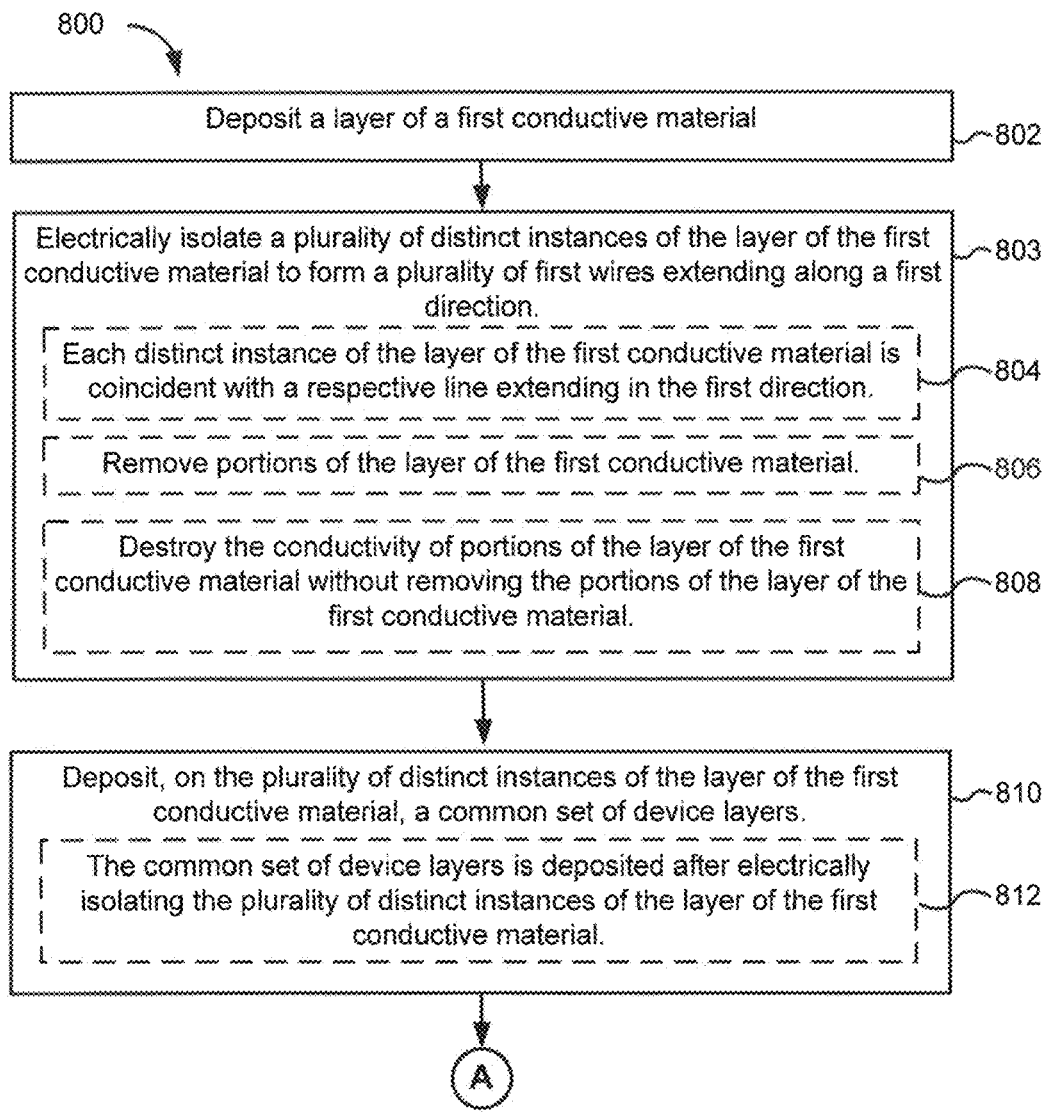
FIGS. 8A-8B illustrate a flowchart for a process for manufacturing an array of SOT-MRAM devices in accordance with some implementations.
Figure 8B:
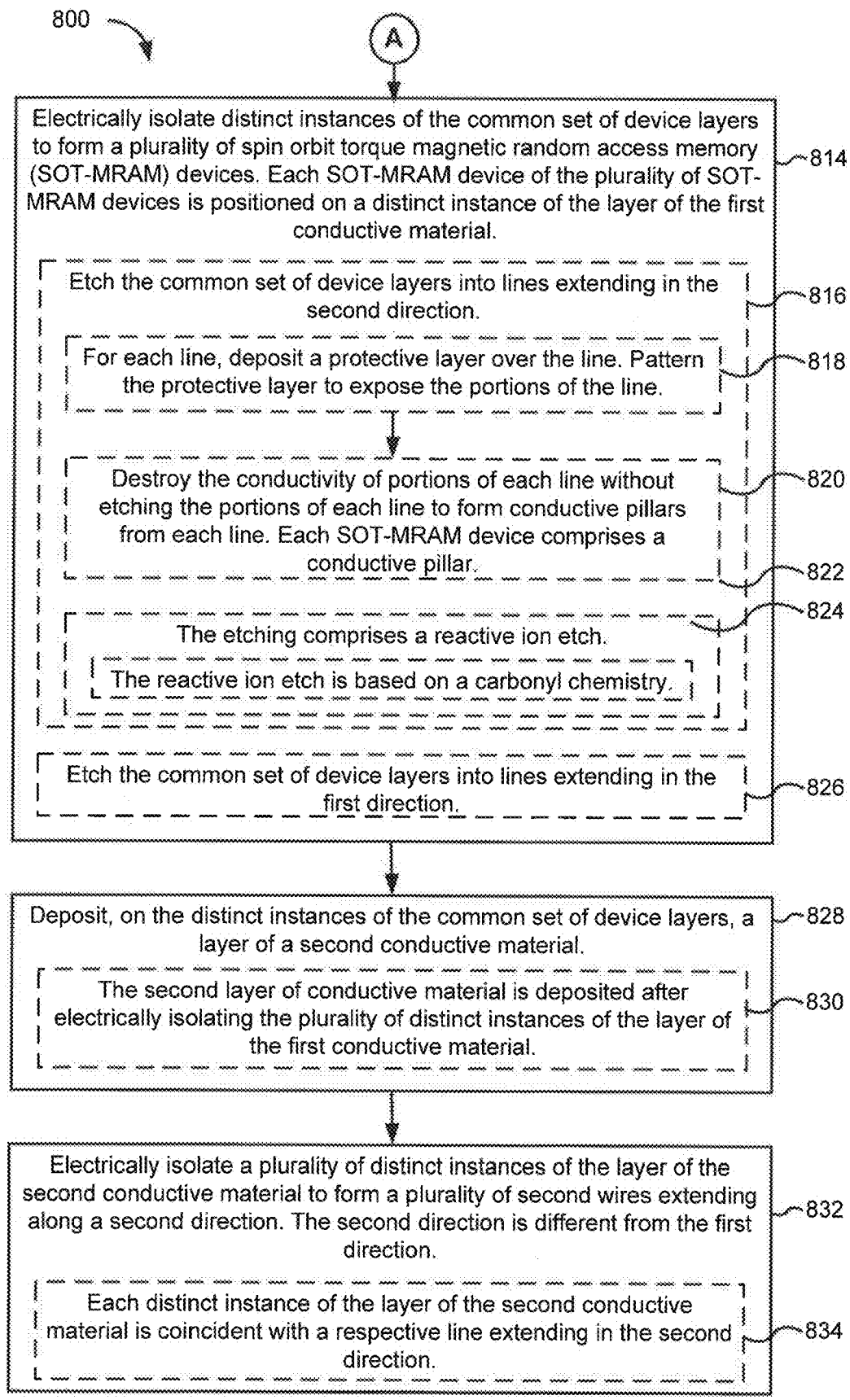

FIGS. 7A-7F graphically illustrate a process 700 for manufacturing a magnetic storage device (e.g., an array of SOT-MRAM devices) in accordance with some implementations. In some embodiments, process 700 is used to manufacture any of the devices described herein (e.g., magnetic storage device 100, FIG. 1, magnetic storage device 300, FIG. 3, and/or magnetic storage device 400, FIG. 4). In some embodiments, the steps shown in FIGS. 7A-7F are used to graphically illustrate the operations described in process 800 (FIGS. 8A-8B). In some embodiments, the operations shown in FIGS. 7A-7F are shown sequentially (e.g., the operations shown in FIG. 7A are performed before the operations shown in FIG. 7B, which are performed before the operations shown in FIG. 7C, and so on). In some circumstances, the order of operations is not important and one of skill in the art will recognize how to re-order certain operations.

In some circumstances, process 700 produces arrays of SOT-MRAM devices with a pitch on the order of 2-4 F, with 2-3 F bit-to-bit separation, and very high bit densities of 4-12 $F^2$.

In operation 702 (FIG. 7A), word lines 304 are formed. In some embodiments, word lines 304 (only a few of which, e.g., word lines 304a-304c, are labeled) are formed by depositing a conductive material on a substrate (e.g., substrate 124, FIG. 3) and patterning the conductive material (e.g., such that each word line 304 is a distinct instance of the conductive material). In some embodiments, a plurality of word lines 304 are formed in this manner. In some embodiments, the word lines 304 are lines (e.g., straight lines). In some embodiments, the word lines 304 extend in a first direction (e.g., along a surface of the substrate).

It should be noted that various operations in process 700 include depositing and patterning a conductive material. For any of these operations, in some embodiments, patterning the conductive material includes etching portions of the conductive material to remove the portions of the conductive material. In some embodiments, patterning the conductive material includes destroying the conductivity of portions of the conductive material to form the distinct instances of the conductive material (e.g., through ion bombardment). In some embodiments, the conductive material is a metal. In some embodiments, the conductive material is deposited by sputtering, a chemical deposition technique, a physical deposition technique, evaporation, and/or an epitaxial growth technique. In some embodiments, any of the patterning operations described herein can be performed using photolithography.

It should also be noted that any of the physical gaps shown in FIGS. 7A-7F (e.g., between distinct instances of a layer) are typically filled in with an inert (e.g., non-magnetic, insulating material). In some embodiments, after a layer is patterned and the gaps are filled in, the layer is planarized so that a flat surface is provided for the next layer to be deposited on.

In operation 704, source lines 604 are formed. In some embodiments, source lines 604 (only a few of which, e.g., source lines 604a-604c are labeled) are formed by depositing a conductive material on top of the word lines 304 and patterning the conductive material (e.g., such that each source line 604 is a distinct instance of the conductive material). In some embodiments, a plurality of source lines 604 are formed in this manner. In some embodiments, the source lines 604 are lines (e.g., straight lines). In some embodiments, the source lines 604 extend in a second direction (e.g., perpendicular to the first direction and along the surface of the substrate).

In some embodiments, the source lines 604 are electrically isolated from the word lines 304. In some embodiments, a thin layer of insulating material is deposited between the layer forming the word lines 304 and the layer forming the source lines 604. In some embodiments (not shown), a grid of transistors is fabricated such that each transistor has a terminal connected to a source line and a terminal connected to a word line. For example, in some embodiments, the transistor is a field effect transistor (FET) having a gate, source, and drain. The gate of each transistor is electrically coupled with a respective word line and the source (or drain) of each transistor is electrically coupled with a respective source line. In some embodiments, each transistor on the grid is coupled to a different combination of source line and word line.

For visual clarity, the word lines 304 and source lines 604 are not shown in the remainder of FIGS. 7B-7F. However, it should be understood that word lines 304 and source lines 604, and the transistors described above, are formed underneath the remaining structures fabricated in process 700 (e.g., proximal to the substrate).

In operation 706 (FIG. 7B), a plurality of first wires 102 are formed (e.g., SOT wires) (only a few of which, e.g., first wires 102a-102c, are shown). In some embodiments, the plurality of first wires 102 is formed by electrically isolating a plurality of distinct instances of the layer of the first conductive material to form a plurality of first wires 102 extending along the first direction (e.g., such that the first wires 102 are parallel to the word lines, described above). In some embodiments, electrically isolating the first wires 102 includes forming a non-magnetic material 707 between the first wires 102. In some embodiments, the first wire 102 comprises a first conductive material. In some embodiments, the first wire 102 comprises a material exhibiting a strong spin Hall effect (SHE). In some embodiments, the first wire 102 comprises a heavy metal. In some embodiments, the first wire 102 comprises Pt, Ta, W, or an alloy thereof. In some embodiments, the first wire 102 has a thickness 709 in a range of 2 to 100 nm, preferably 5 to 80 nm, and more preferably from 8 to 50 nm (this value may depend on a target resistance).

In operation 708 (FIG. 7C), a common set of device layers is deposited. In some embodiments, the common set of device layers includes a magnetic storage layer 108, a spacing layer 110, and a magnetic reference layer 112. In some embodiments, the magnetic storage layer 108 is deposited first (e.g., adjacent to the SOT wires). In some embodiments, the common set of device layers are applied on (e.g., on top of) the SOT wires (e.g., applied on the layer forming the first wires 102).

In some embodiments, the spacing layer 110 is a tunnel barrier. In some embodiments, the spacing layer 110 comprises an insulating material. In some embodiments, spacing layer 110 comprises a material selected from the group consisting of MgO, SiOx, AlOx, or an alloy thereof. In some embodiments, spacing layer 110 has a thickness of 0.2 to 2 nanometers (nm), which may depend on a target resistance. In some embodiments, the spacing layer 110 is deposited using a sputtering methodology (e.g., from either a MgO sintered target or by depositing Mg metal allowing it to oxidize).

In some embodiments, the magnetic storage layer 108 (also sometimes called a "free layer") includes a plurality of sub-layers (e.g., individually deposited sub-layers). In some embodiments, the sub-layers include a metal buffer layer that serves as a perpendicular magnetic anisotropy (PMA) enhancer. In some embodiments, the sub-layers include one or more sub-layers comprising a material selected from the group consisting of Ta, Cr, W, V, Mo, Pt, Ru, Pd, Cu, Ag, Rh, or an alloy thereof. In some embodiments, the magnetic reference layer 108 has a thickness of 1 to 10 nm, and preferably 1 to 5 nm.

In some embodiments, the magnetic reference layer 112 (also sometimes called a "fixed layer") includes a plurality of sub-layers (e.g., individually deposited sub-layers). In some embodiments, the sub-layers include one or more sub-layers comprising a material of the group consisting of CoFeB, CoFe, CoFeNi, FeNi, FeB, or an alloy thereof. In some embodiments, the sub-layers include a plurality of Co/(Pt, Pd) multilayers. In some embodiments, the sub-layers include one or more sub-layers comprising a Heusler Alloy (e.g., a material selected from the group consisting of CoMnSi, CoMnGe, CoMnAl, CoMnFeSi, CoFeSi, CoFeAl, CoCrFeAl, CoFeAlSi). In some embodiments, the sub-layers include a capping layer as a PMA Enhancer. In some embodiments, the sub-layers comprise a synthetic ferrimagnet that includes at least two magnetic sub-layers separated by a non-magnetic sub-layer. In some embodiments, the non-magnetic layer comprises a material selected from the group consisting of Ru, Cr, Ir, V, Au, Ag, or an alloy thereof. In some embodiments, the capping layer comprises a material selected from the group consisting of Ta, Cr, W, V, Pt, Ru, Pd, Cu, Ag, Rh, or an alloy thereof. In some embodiments, the capping layer comprises MgO. In some embodiments, the capping layer has a thickness in the range of 1 to 10 nm. In some embodiments, the magnetic reference layer 112 has a thickness (e.g., in total) in the range of 1 to 20 nm, preferably 1 to 10 nm, more preferably 1 to 5 nm.

Note that the thicknesses referred to above refer to the same dimension as thickness 709, but for visual clarity, the thicknesses of the device layers are not labeled in the figure.

Operations 710-716 (FIGS. 7D-7E) illustrate electrically isolating distinct instances of the common set of device layers to form a plurality of spin orbit torque magnetic random access memory (SOT-MRAM) devices. Each SOT-MRAM device of the plurality of SOT-MRAM devices is positioned on a distinct instance of the layer of the first conductive material. In some embodiments, each SOT-MRAM device stores one or more bits. Thus, in some embodiments, operations 710-716 serve to isolate the bits of the magnetic storage device.

To that end, in operation 710, trenches 711 are formed to form lines of the common set of device layers. In some embodiments, the lines of the common set of device layers are perpendicular to the SOT wires 102. In some embodiments, the lines of the common set of device layers are parallel to the SOT wires 102.

In some embodiments, forming trenches 711 includes etching the common set of device layers. In some embodiments, the etching of the common set of device layers is performed using ion beam milling, reactive ion etching, oxidation, nitrization, ion implementation, or any combination of these techniques. In some embodiments, the etching of the common set of device layers is performed using reactive ion etching using a carbonyl chemistry. In some embodiments, the reactive ion etching is performed with a reactive ion beam that is incident upon the surface at an angle. In some embodiments, the angle is between 45-80 degrees, and preferably between 60-80 degrees. Below 45 degrees, the size of the devices becomes too large and the density/capacity is lower. Using angles above 80 degrees results in lower tunneling resistance change, which degrades the read/write performance of the devices. The angle is measured from the normal axis to the horizontal direction of the planar magnetic layers.

These etching processes allow for SOT-MRAM devices to be manufactured on very small scales (e.g., high densities) while avoiding shunting of the spacing layer 110, which is a problem with conventional methods of manufacturing MRAM devices.

In some embodiments, the trenches formed by this process have a trench wall angle between 10-45 degrees (e.g., from the normal of the substrate), and more preferably between 10-30 degrees. It is noted that trench wall angles greater than 45 degrees leads to a larger device size, which results in lower memory density/capacity. In contrast, trench wall angles below 10 degrees result in increased risk of shunting (e.g., shorting) the spacing layer 110, which results in decreased yield.

In operation 712, a protective layer is deposited and patterned on the common set of device layers. In some embodiments, the protective layer comprises a photoresist and/or metal layer. The photoresist and/or metal layer 715 is patterned to form lines in a direction perpendicular to the trenches 711. In some embodiments, the lines of the photoresist and/or metal layer 715 are parallel to and aligned with (e.g., coincident with) the first wires 102 (e.g., the SOT wires). In some embodiments, while the patterned photoresist or metal layer is in place, the conductivity of exposed portions 713 of each line of the common set of layers is destroyed. The photoresist and/or metal layer is subsequently removed.

In operation 714, a plurality of distinct instances of a layer of a second conductive material is deposited and patterned to form a plurality of second wires 314 (e.g., top electrodes) extending along a second direction. The second direction is different from the first direction of the first wires 102 (e.g., perpendicular to the first wires 102).

In operation 716, the trenches 711 are filled in with a non-magnetic insulator.

In operation 718 (FIG. 7F), a bit line (e.g., bit line 302, FIG. 3) is formed on top of the second wires. The bit line is a conductive material that is electrically coupled with the second wires. In addition, first transistors 116 (described previously) are formed. In some embodiments, each first transistor 116 is formed adjacent to a respective first wire 102 and a terminal (e.g., a source or a drain) of the first transistor 116 is electrically coupled to the respective first wire 102.

FIGS. 8A-8B illustrate a process (e.g., method) 800 for manufacturing an array of SOT-MRAM devices in accordance with some implementations. In some embodiments, process 800 is used to manufacture any of the devices described herein (e.g., magnetic storage device 100, FIG. 1, magnetic storage device 300, FIG. 3, and/or magnetic storage device 400, FIG. 4). In some embodiments, the steps shown in FIGS. 8A-8B are graphically illustrated in FIGS. 7A-7F. For brevity, the operations described with reference to FIGS. 7A-7F are not repeated here.

In some circumstances, process 800 produces arrays of SOT-MRAM devices with a pitch on the order of 2-4 F, with 2-3 F bit-to-bit separation, and very high bit densities of 4-12 $F^2$.

The method comprises depositing (802) a layer of a first conductive material. In some embodiments, the first conductive material exhibits a high spin Hall effect.

The method includes electrically isolating (803) a plurality of distinct instances of the layer of the first conductive material to form a plurality of first wires (e.g., SOT wires) extending along a first direction. Operations 802-803 are graphically depicted in FIG. 7B and described with reference to the same.

In some implementations, each distinct instance of the layer of the first conductive material is (804) coincident with a respective line extending in the first direction (e.g., a word line) (e.g., as described with reference to FIG. 7A).

In some implementations, electrically isolating the plurality of distinct instances of the layer of the first conductive material comprises (806) removing portions of the layer of first conductive material (e.g., etching the first conductive material).

In some implementations, electrically isolating the plurality of distinct instances of the layer of the first conductive material comprises (808) destroying the conductivity of portions of the layer of first conductive material without removing the portions of the layer of first conductive material (e.g., through oxidation or nitrization).

The method includes depositing (810), on the plurality of distinct instances of the layer of the first conductive material, a common set of device layers (e.g., as described with reference to FIG. 7C). In some embodiments, the common set of device layers includes a magnetic storage layer, a magnetic reference layer, and a spacing layer (e.g., an insulating layer). In some embodiments, the magnetic storage layer is proximal to (e.g., adjacent to) the first conductive material.

In some implementations, the common set of device layers is deposited (812) after electrically isolating the plurality of distinct instances of the layer of the first conductive material (e.g., such that SOT wires are formed underneath the common set of device layers).

The method includes electrically isolating (814) distinct instances of the common set of device layers to form a plurality of spin orbit torque magnetic random access memory (SOT-MRAM) devices. Each SOT-MRAM device of the plurality of SOT-MRAM devices is positioned on a distinct instance of the layer of the first conductive material (e.g., as described with reference to FIGS. 7D-7E).

In some implementations, electrically isolating the distinct instances of the common set of device layers comprises etching (816) the common set of device layers into lines extending in the second direction. For example, in some embodiments, trenches (e.g., trenches 711, FIG. 7D) are etched into the common set of device layers. Various techniques and chemistries for etching trenches 711 are described above.

In some implementations, the method further includes, prior to destroying the conductivity of portions of each line without etching the portions of each line (e.g., operations 820, 826 below), depositing (818) a protective layer over the line and patterning the protective layer to expose the portions of the line (e.g., as described with reference to operation 712, FIG. 7E).

In some implementations, electrically isolating the distinct instances of the common set of device layers further comprises destroying (820) the conductivity of portions of each line without etching the portions of each line to form conductive pillars from each line, wherein each SOT-MRAM device comprises a conductive pillar. For example, the pillar are made of conductive materials, with the exception of a thin insulating layer that forms a tunneling barrier.

In some implementations, wherein the etching comprises (822) a reactive ion etch. In some implementations, the reactive ion etch is (824) based on a carbonyl chemistry.

In some implementations, electrically isolating the distinct instances of the common set of device layers comprises etching (826) the common set of device layers into lines extending in the first direction.

The method includes depositing (828), on the distinct instances of the common set of device layers, a layer of a second conductive material (e.g., the layer from which second wires 314, FIG. 3, are formed, as described with reference to operation 714, FIG. 7E).

In some implementations, the second layer of conductive material is deposited (830) after electrically isolating the plurality of distinct instances of the layer of the first conductive material (e.g., as described with reference to operation 714, FIG. 7E)

The method includes electrically isolating (832) a plurality of distinct instances of the layer of the second conductive material to form a plurality of second wires extending along a second direction. The second direction is different from the first direction (e.g., as shown in FIG. 3, the first wires 102 and the second wires 314 are perpendicular).

In some implementations, each distinct instance of the layer of the second conductive material is (834) coincident with a respective line extending in the second direction (e.g., a source line).

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first device could be termed a second device, and, similarly, a second device could be termed a first device, without departing from the scope of the various described implementations. The first device and the second device are both devices, but they are not the same device.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific implementations.

However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A method of fabricating a magnetic storage device, comprising:
   depositing a layer of a first conductive material;
   electrically isolating a plurality of distinct instances of the layer of the first conductive material to form a plurality of first wires extending along a first direction;
   depositing, on the plurality of distinct instances of the layer of the first conductive material, a common set of device layers;
   electrically isolating distinct instances of the common set of device layers to form a plurality of spin orbit torque magnetic random access memory (SOT-MRAM) devices, wherein each SOT-MRAM device of the plurality of SOT-MRAM devices is positioned on a distinct instance of the layer of the first conductive material;
   depositing, on the distinct instances of the common set of device layers, a layer of a second conductive material; and
   electrically isolating a plurality of distinct instances of the layer of the second conductive material to form a plurality of second wires extending along a second direction, wherein the second direction is different from the first direction.

2. The method of claim 1, wherein electrically isolating the distinct instances of the common set of device layers comprises etching the common set of device layers into lines extending in the second direction.

3. The method of claim 2, wherein electrically isolating the distinct instances of the common set of device layers further comprises destroying the conductivity of portions of each line without etching the portions of each line to form conductive pillars from each line, wherein each SOT-MRAM device comprises a conductive pillar.

4. The method of claim 3, further including, prior to destroying the conductivity of portions of each line without etching the portions of each line:
   depositing a protective layer over the line; and
   patterning the protective layer to expose the portions of the line.

5. The method of claim 2, wherein each distinct instance of the layer of the second conductive material is coincident with a respective line extending in the second direction.

6. The method of claim 1, wherein electrically isolating the distinct instances of the common set of device layers comprises etching the common set of device layers into lines extending in the first direction.

7. The method of claim 6, wherein each distinct instance of the layer of the first conductive material is coincident with a respective line extending in the first direction.

8. The method of claim 2, wherein the etching comprises a reactive ion etch.

9. The method of claim 8, wherein the reactive ion etch is based on a carbonyl chemistry.

10. The method of claim 1, wherein the common set of device layers is deposited after electrically isolating the plurality of distinct instances of the layer of the first conductive material.

11. The method of claim 1, wherein the second layer of conductive material is deposited after electrically isolating the plurality of distinct instances of the layer of the first conductive material.

12. The method of claim 1, wherein electrically isolating the plurality of distinct instances of the layer of the first conductive material comprises removing portions of the layer of first conductive material.

13. The method of claim 1, wherein electrically isolating the plurality of distinct instances of the layer of the first conductive material comprises destroying the conductivity of portions of the layer of first conductive material without removing the portions of the layer of first conductive material.

* * * * *